(12) United States Patent
Lim et al.

(10) Patent No.: US 12,396,287 B2
(45) Date of Patent: *Aug. 19, 2025

(54) IMAGE SENSOR

(71) Applicant: SAMSUNG ELECTRONICS CO., LTD., Suwon-si (KR)

(72) Inventors: KangMook Lim, Sejong-si (KR); Dae Hoon Kim, Seoul (KR); Seung Sik Kim, Hwaseong-si (KR); Ji-Youn Song, Seoul (KR); Jae Hoon Jeon, Hwaseong-si (KR); Dong Seok Cho, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/505,392

(22) Filed: Nov. 9, 2023

(65) Prior Publication Data

US 2024/0079437 A1 Mar. 7, 2024

Related U.S. Application Data

(63) Continuation of application No. 17/315,589, filed on May 10, 2021, now Pat. No. 11,855,115.

(30) Foreign Application Priority Data

Sep. 9, 2020 (KR) .......... 10-2020-0115121

(51) Int. Cl.
*H10F 39/00* (2025.01)

(52) U.S. Cl.
CPC ......... *H10F 39/811* (2025.01); *H10F 39/802* (2025.01); *H10F 39/8053* (2025.01); *H10F 39/8063* (2025.01)

(58) Field of Classification Search
CPC . H01L 28/40–92; H01L 27/146–14698; H01L 27/1464; H01L 23/5222;
(Continued)

(56) References Cited

U.S. PATENT DOCUMENTS 11,855,115 B2 * 12/2023 Lim ................ H01L 27/14605
2013/0001403 A1 * 1/2013 Yamakawa ........... H10F 39/813
257/E31.093

(Continued)

FOREIGN PATENT DOCUMENTS

JP 2017-055084 3/2017
KR 10-2013-0007444 A 1/2013
(Continued)

OTHER PUBLICATIONS

Taiwanese Office Action dated Nov. 22, 2024 in related TW Application No. 110131570 (7 pages), in Chinese.
(Continued)

*Primary Examiner* — Eric A. Ward
*Assistant Examiner* — Nora T. Nix
(74) *Attorney, Agent, or Firm* — MORGAN, LEWIS & BOCKIUS LLP

(57) ABSTRACT

An image sensor includes a plurality of unit pixels, each including: a substrate including first and second sides which are opposite to each other, a photoelectric conversion layer in the substrate, and a wiring structure on the first side of the substrate. The wiring structure may include: a first capacitor, a second capacitor spaced from the first capacitor, a plurality of edge vias arranged along edges of the unit pixel, and a plurality of central vias interposed between the first capacitor and the second capacitor.

11 Claims, 16 Drawing Sheets

(58) Field of Classification Search
CPC ......... H01L 23/5223; H01L 21/823475; H01L 21/823871; H01L 29/41725–41791; H01L 29/7839; H01L 27/14603–14616; H01L 29/806; H01L 23/522–53295; H01L 21/768–76898; H10F 39/811; H10F 39/18; H10F 39/80–813; H10F 39/014; H10F 39/018; H10F 39/026; H10F 39/12–199

See application file for complete search history.

(56) References Cited

U.S. PATENT DOCUMENTS

| | | |
|---|---|---|
| 2013/0087885 A1 | 4/2013 | Huang et al. |
| 2016/0268144 A1* | 9/2016 | Voiron ................. H10D 84/212 |
| 2019/0181178 A1* | 6/2019 | Takase .................. H10D 1/692 |
| 2019/0198599 A1* | 6/2019 | Son ....................... H10K 50/84 |
| 2019/0252488 A1 | 8/2019 | Koyanagi et al. |
| 2020/0058688 A1 | 2/2020 | Kwon et al. |
| 2020/0075656 A1 | 3/2020 | Lee et al. |
| 2020/0105810 A1 | 4/2020 | Moon et al. |
| 2020/0111831 A1 | 4/2020 | Choi et al. |
| 2020/0127034 A1 | 4/2020 | Zhang et al. |
| 2020/0185445 A1* | 6/2020 | Yamagishi ............ H10F 39/182 |
| 2020/0389608 A1 | 12/2020 | Baek et al. |
| 2022/0013555 A1 | 1/2022 | Krueger et al. |
| 2022/0077216 A1 | 3/2022 | Lim et al. |

FOREIGN PATENT DOCUMENTS

| | | |
|---|---|---|
| KR | 10-2019-0079309 A | 7/2019 |
| KR | 10-2020-0018465 A | 2/2020 |
| KR | 10-2020-0039076 A | 4/2020 |
| TW | 201106691 A | 2/2011 |

OTHER PUBLICATIONS

Taiwanese Search Report in related TW Application No. 110131570 (2 pages), in Chinese.
Korean Office Action dated Dec. 14, 2024 in corresponding Korean Patent Application No. KR 10-2020-0115121, in Korean, 8 pages.

* cited by examiner

IMAGE SENSOR

CROSS-REFERENCE TO RELATED APPLICATION

This application is a continuation of U.S. patent application Ser. No. 17/315,589, filed May 10, 2021, which claims priority from Korean Patent Application No. 10-2020-0115121 filed on Sep. 9, 2020 in the Korean Intellectual Property Office, and all the benefits accruing therefrom under 35 U.S.C. 119, the contents of which in its entirety are herein incorporated by reference.

TECHNICAL FIELD

The present disclosure relates generally to an image sensor and more particularly to an image sensor capable of performing a global shutter operation.

DESCRIPTION OF THE RELATED ART

An image sensor is a semiconductor device that converts optical information into an electric signal. Image sensors prevalent today include charge coupled device (CCD) image sensors and complementary metal-oxide semiconductor (CMOS) image sensors.

An image sensor may be configured in the form of a package. The package may be configured with a structure that protects the image sensor and allows incident light to reach a photo receiving surface or a sensing region of the image sensor.

Recently, a backside illumination (BSI) image sensor has been proposed. With a BSI image sensor, incident light is radiated through a back side of a semiconductor substrate, which results in improved light-receiving efficiency and sensitivity for the pixels of the image sensor.

SUMMARY

Aspects of the inventive concept provide an image sensor having an improved degree of integration.

According to an aspect of the present disclosure, there is provided an image sensor which includes a plurality of unit pixels, where each unit pixel includes: a substrate including first and second sides which are opposite to each other, a photoelectric conversion layer in the substrate, and a wiring structure adjacent to the first side of the substrate. The wiring structure may include: a first capacitor, a second capacitor spaced from the first capacitor, a plurality of edge vias arranged along edges of the unit pixel, and a plurality of central vias interposed between the first capacitor and the second capacitor.

According to another aspect of the present disclosure, there is provided an image sensor comprising: a substrate including first and second sides which are opposite to each other, a photoelectric conversion layer in the substrate, a first interlayer insulation film on the first side of the substrate, a lower electrode pad and a central wiring spaced apart from each other, on the first interlayer insulation film, a second interlayer insulation film which covers the lower electrode pad and the central wiring, on the first interlayer insulation film, a first upper electrode pad and a second upper electrode pad spaced apart from each other, on the second interlayer insulation film, a first capacitor connected to the lower electrode pad and the first upper electrode pad, in the second interlayer insulation film, a second capacitor connected to the lower electrode pad and the second upper electrode pad, in the second interlayer insulation film, and a central via, which penetrates the second interlayer insulation film and is connected to the central wiring, between the first capacitor and the second capacitor.

According to another aspect of the present disclosure, there is provided an image sensor which includes a plurality of unit pixels, the image sensor comprising: a substrate including a first side and a second side which are opposite to each other, a photoelectric conversion layer in the substrate, a first sampling transistor and a second sampling transistor on the first side of the substrate, a wiring structure which covers the first sampling transistor and the second sampling transistor, on the first side of the substrate, a first capacitor connected to a source/drain region of the first sampling transistor, in the wiring structure of each of the unit pixels, a second capacitor connected to a source/drain region of the second sampling transistor, in the wiring structure of each of the unit pixels, a plurality of edge vias arranged along edges of each of the unit pixels, in the wiring structure, a plurality of central vias interposed between the first capacitor and the second capacitor, in the wiring structure, and a color filter and a microlens which are sequentially stacked on the second side of the substrate.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF EMBODIMENTS

In the following description, although terms such as first and second are used herein to describe various elements or components, such terms are used to simply distinguish a single element or component from other elements or components.

Herein, when an element is said to "include" a component or material, the component or material may be a fractional part of the element in some examples, but in other examples, if applicable, the element is composed entirely of the component or material.

Herein, when a circuit element is said to be connected to a power supply voltage or other voltage, the circuit element is connected to a node or terminal at which the voltage is present.

Herein, an "end" of a field effect transistor (FET) is a source or a drain of the FET, and an "opposite end" is the other of the source or drain of the FET.

Herein, a "wiring" is a conductive line that connects a first circuit element such as a via to another circuit element in some examples. In other examples, a "wiring" is just a conductive pad. Hereinafter, exemplary image sensors according to some embodiments will be explained referring to FIGS. 1 to 17.

Figure 1:
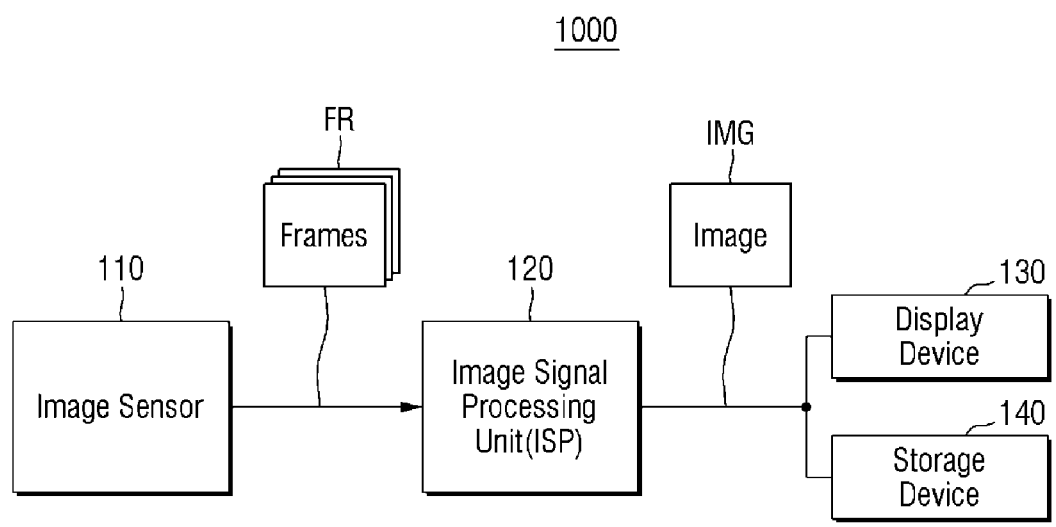
FIG. 1 is an exemplary block diagram of an image processing device according to some embodiments.

FIG. 1 is an exemplary block diagram of an image processing device, 1000, according to some embodiments. The image processing device 1000 may include an image sensor 110, an image signal processor (ISP) 120, a display device 130, and a storage device 140. The image processing device 1000 may be part of any suitable type of electronic device that acquire external image, such as a smart phone and a digital camera.

The image sensor 110 may convert an externally provided optical signal into an electric signal. The image sensor 110 may include a plurality of unit pixels. Each unit pixel of the image sensor 110 may, for example, receive light reflected from an external object and convert the received light into an electrical image signal or photographic signal.

The image signal processor 120 may perform signal processing on frame data FR (interchangeably, "image signal" or a "photographic signal") provided from the image sensor 110 to output corrected image data IMG. For example, the image signal processor 120 may perform signal processing operations such as color interpolation, color correction, gamma correction, color space conversion, and edge correction on the received frame data FR to generate image data IMG. The image signal processor 120 includes processing circuitry that may read instructions from and store data to memory of storage device 140.

The display device 130 may output the image data IMG provided from the image signal processor 120 to be displayed and/or stored or transmitted. For example, the display device 130 may include at least one of various display panels such as a liquid crystal display panel, an organic light-emitting display panel, an electrophoretic display panel, and an electrowetting display panel. The display device 130 may display the image data IMG through the display panel.

The storage device 140 may be configured to store the image data IMG from the image signal processor 120. The storage device 140 may also include volatile memory elements such as a SRAM (Static RAM), a DRAM (Dynamic RAM), and a SDRAM (Synchronous DRAM), or may include non-volatile memory elements such as a ROM (Read Only Memory), a PROM (Programmable ROM), an EPROM (Electrically Programmable ROM), an EEPROM (Electrically Erasable and Programmable ROM), a flash memory device, a PRAM (Phase-change RAM), a MRAM (Magnetic RAM), a RRAM (Resistive RAM), and a FRAM (Ferroelectric RAM).

Figure 2:
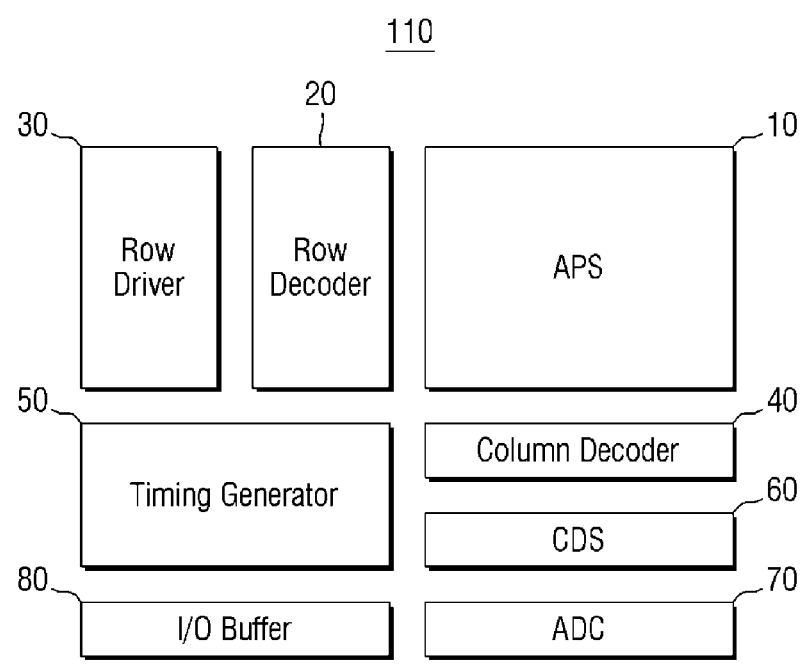
FIG. 2 is an exemplary block diagram of the image sensor of FIG. 1.

FIG. 2 is an exemplary block diagram of the image sensor of FIG. 1. The image sensor 110 according to some embodiments may include an active pixel sensor array (APS) 10, a row decoder 20, a row driver 30, a column decoder 40, a timing generator 50, a correlated double sampler (CDS) 60, an analog to digital converter (ADS) 70, an input/output (I/O) buffer 80.

The active pixel sensor array 10 includes a plurality of unit pixels arranged two-dimensionally, and may convert an optical signal into an electric signal. The active pixel sensor array 10 may be driven by a plurality of drive signals, such as a pixel selection signal, a reset signal, and a charge transmission signal, from the row driver 30. The electrical signal converted by the active pixel sensor array 10 may be provided to the CDS 60.

The row driver 30 may provide a large number of drive signals for driving a plurality of unit pixels according to the result decoded by the row decoder 20 to the active pixel sensor array 10. When the unit pixels are arranged in the form of a matrix, the drive signals may be provided for each row.

The timing generator 50 may provide a timing signal and a control signal to the row decoder 20 and the column decoder 40.

The CDS 60 may receive, hold and sample the electrical signals generated by the active pixel sensor array 10. The CDS 60 doubly samples a noise level, and a signal level of the electrical signal, and may output a difference level corresponding to a difference between the noise level and the signal level.

The analog-to-digital converter (ADC) 70 may convert the analog signal corresponding to the difference level, which is output from the correlated double sampler 60, into a digital signal and output the same.

The input/output buffer 80 latches the digital signal, and the latched signal may sequentially output the digital signal to the image signal processor according to decoding results in the column decoder 40.

Figure 3:
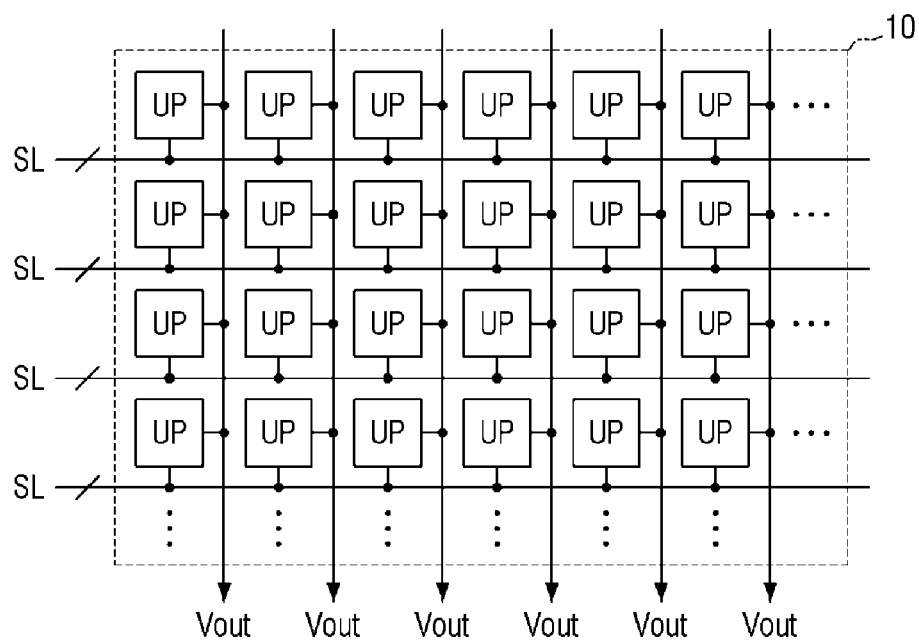
FIG. 3 is a schematic block diagram of the active pixel sensor array of the image sensor of FIG. 2.

FIG. 3 is a schematic block diagram of an example active pixel sensor array of the image sensor of FIG. 2. Here, the active pixel sensor array 10 may include a plurality of unit pixels UP, a plurality of drive signal lines SL, and output lines each outputting a voltage Vout.

The unit pixels UP may be arranged two-dimensionally along a plurality of rows and a plurality of columns. An electrical signal may be generated by an optical signal in each unit pixel UP.

Each unit pixel UP may be driven through drive signal lines SL connected to each unit pixel UP. The drive signal lines SL may extend in a row direction (a horizontal direction) so that the unit pixels UP included in the same row are driven at the same time. The drive signal lines SL may include a transmission signal line, a reset signal line, a first sampling signal line, a second sampling signal line, a pre-charge signal line, and a selection signal line. The transmission signal line, the reset signal line, and the selection signal line may be commonly connected to the unit pixels UP of the same row.

The output lines carrying voltages Vout may extend in a column direction (a vertical direction). The output lines may be commonly connected to the unit pixels UP arranged in the same column.

Each unit pixel UP may include a plurality of MOS transistors that constitutes a photoelectric conversion element, a readout circuit, and a sampling circuit.

The photoelectric conversion elements of the unit pixels UP may generate electric charges (optical charges) in proportion to an amount of light incident from the outside. The generated electric charges may be converted into voltage and stored.

Each unit pixel UP may include a sampling circuit that samples and holds the electric charges generated from the photoelectric conversion element. The image sensor according to some embodiments may perform a global shutter operation. For instance, at the time of the operation of the image sensor according to some embodiments, all the unit pixels UP are simultaneously exposed to the optical signal provided from the exterior, and the electric charges may be simultaneously stored in each unit pixel UP. The pixel signals derived from the stored electric charges may be output sequentially row by row.

Figure 4A:
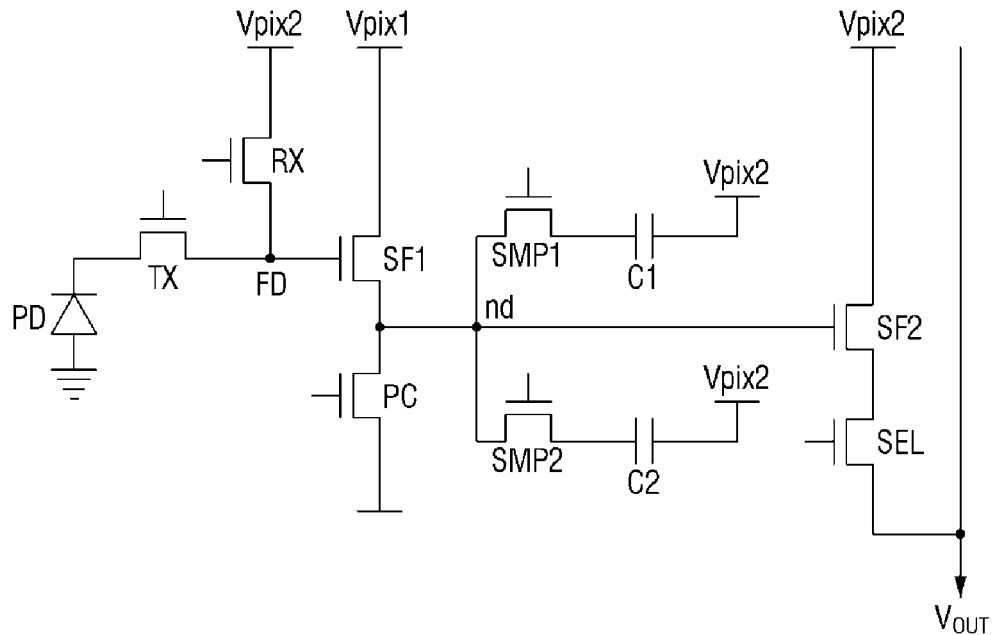
FIGS. 4A, 4B and 4C are respective exemplary circuit diagrams of unit pixels of the image sensor according to some embodiments.
Figure 4B:
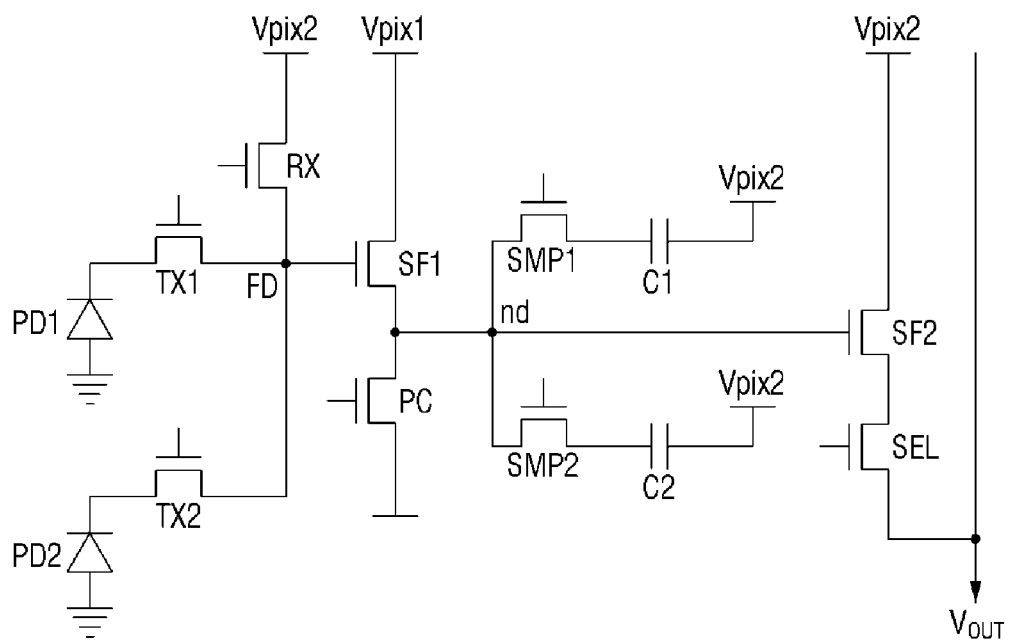
Figure 4C:
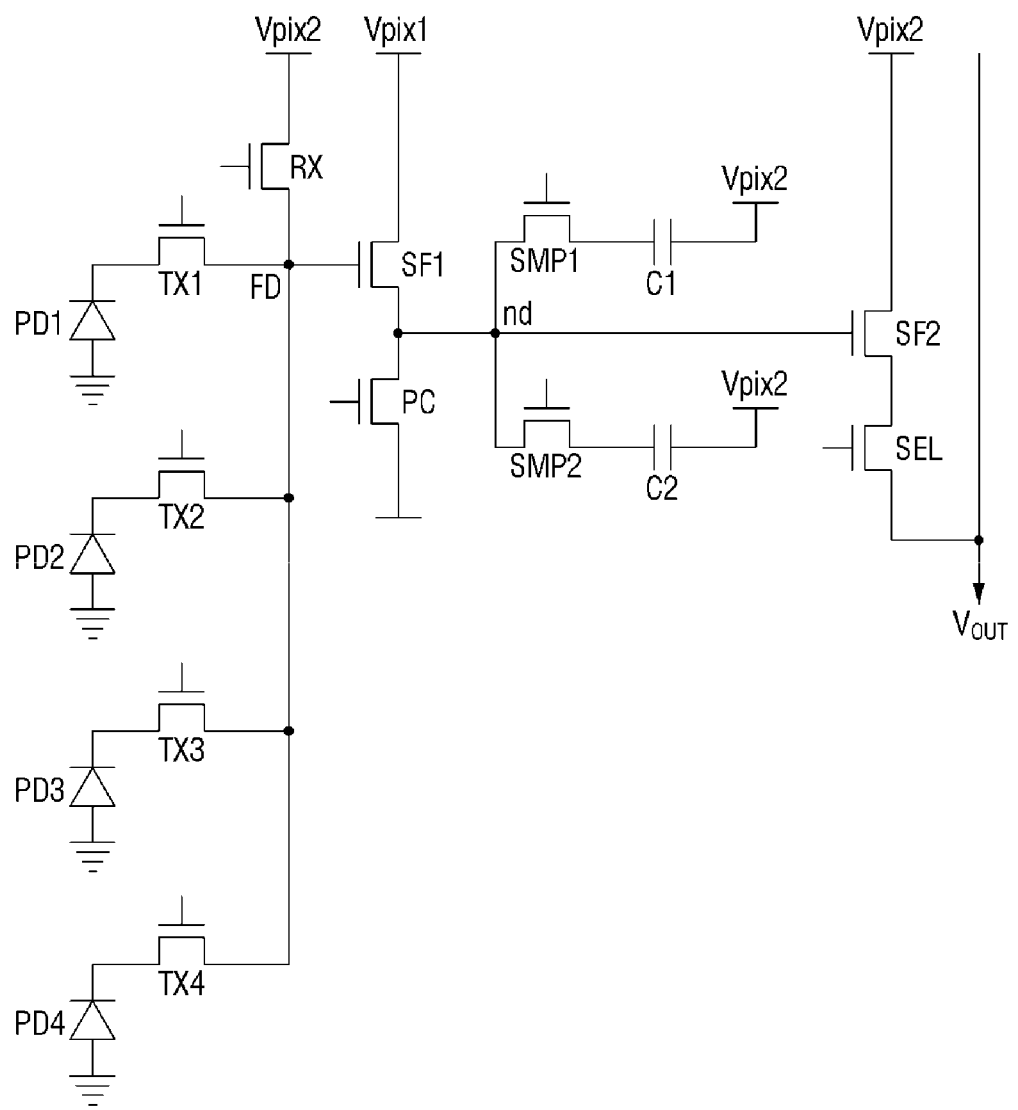

FIGS. 4A to 4C are various exemplary circuit diagrams for explaining the unit pixels of the image sensor according to some embodiments.

Referring to FIGS. 1 to 4A, the respective unit pixels (e.g., UP of FIG. 3) of the image sensor according to some embodiments may include a photoelectric conversion element PD, a transfer transistor TX, a reset transistor RX, a first source follower transistor SF1, a pre-charge transistor PC, a first sampling transistor SMP1, a second sampling transistor SMP2, a second source follower transistor SF2, a selection transistor SEL, a first capacitor C1 and a second capacitor C2.

The photoelectric conversion element PD may generate and store electric charges (optical charges) in proportion to the amount of light incident upon it from the outside environment. The photoelectric conversion element PD may include, for example, but is not limited to, at least one of a photo diode, a photo transistor, a photo gate, a pinned photo diode (PPD) and a combination thereof.

The transfer transistor TX may be connected between the photoelectric conversion element PD and the floating diffusion region FD. The transfer transistor TX may be controlled by a transmission signal applied to a gate electrode thereof (a transfer gate electrode). When the transfer transistor TX is turned on, the electric charges stored in the photoelectric conversion element PD may be transferred to the floating diffusion region FD.

The floating diffusion region FD receives the electric charges generated by the photoelectric conversion element PD and may cumulatively store the electric charges during a frame period. Potential of the gate electrode of the first source follower transistor SF1 may vary, depending on the amount of electric charges stored in the floating diffusion region FD.

The reset transistor RX may periodically reset the floating diffusion region FD to a predetermined voltage level by discharging the accumulated charges. The reset transistor RX may be controlled by a reset signal applied to a gate electrode thereof (a reset gate electrode). A source of the reset transistor RX may be connected to the floating diffusion region FD. When the reset transistor RX is turned on by the reset signal, a predetermined electrical potential (e.g., a second supply voltage Vpix2) provided to a drain of the reset transistor RX may be transferred to the floating diffusion region FD. As a result, when the reset transistor RX is turned on, the optical charges accumulated in the floating diffusion region FD are discharged, and the floating diffusion region FD may be reset.

A gate electrode (a first source/follower gate electrode) of the first source follower transistor SF1 may be connected to the floating diffusion region FD. The first source follower transistor SF1 may be a source follower buffer amplifier that amplifies a potential change of the floating diffusion region FD to generate a source/drain current. A drain of the first source follower transistor SF1 is connected to the power supply voltage (e.g., a first power supply voltage Vpix1), and a source of the first source follower transistor SF1 may be connected to a node nd.

The first sampling transistor SMP1 may be connected between the source (connected to the node nd) of the first source follower transistor SF1 and the first capacitor C1. The first capacitor C1 may be connected to the first sampling transistor SMP1. For example, a first electrode of the first capacitor C1 may be connected to the first sampling transistor SMP1, and a predetermined electrical potential (e.g., a second power supply voltage Vpix2) may be applied to a second electrode of the first capacitor C1. The first sampling transistor SMP1 may be controlled by a first sampling signal that is input to the gate electrode (the first sampling gate electrode). When the first sampling transistor SMP1 is turned on, the first capacitor C1 may sample the electrical signal of the node nd.

The second sampling transistor SMP2 may be connected between the source (or node nd) of the first source follower transistor SF1 and the second capacitor C2. The second capacitor C2 may be connected to the second sampling transistor SMP2. For example, the first electrode of the second capacitor C2 may be connected to the second sampling transistor SMP2, and a predetermined electrical potential (e.g., a second power supply voltage Vpix2) may be applied to the second electrode of the second capacitor C2. The second sampling transistor SMP2 may be controlled by a second sampling signal that is input to its gate electrode (the second sampling gate electrode). When the second sampling transistor SMP2 is turned on, the second capacitor C2 may sample the electrical signal of the node nd.

The gate electrode (a second source/follower gate electrode) of the second source follower transistor SF2 may be connected to the node nd. The second source follower transistor SF2 may be a source follower buffer amplifier that amplifies the potential change of the node nd to generate a source/drain current. A drain of the second source follower transistor SF2 is connected to the power supply voltage (e.g., the second power supply voltage Vpix2), and a source of the second source follower transistor SF2 may be connected to a drain of the selection transistor SEL.

The selection transistor SEL may select a unit pixel to be read for each row. The selection transistor SEL may be controlled by a selection signal that is input to its gate electrode (a selection gate). When the selection transistor SEL is turned on, a pixel signal may be output to the output line Vout.

The operation of the unit pixel of the image sensor according to some embodiments may include a reset step of resetting the photoelectric conversion element PD and the floating diffusion region FD, an optical accumulation step of accumulating optical charges in the photoelectric conversion element PD, and a sampling step of outputting the accumulated optical charges as a pixel signal. The sampling process may include a noise signal sampling step and an image signal sampling step.

At the reset step, the reset transistor RX and the transfer transistor TX may be turned on. Accordingly, the power supply voltage (for example, the second power supply voltage Vpix2) may be provided to the floating diffusion region FD, and the electric charges of the photoelectric conversion element PD and the floating diffusion region FD may be discharged and reset.

After the reset step, the transfer transistor TX may be turned off. At the optical accumulation step, until the turned-off transfer transistor TX is turned on again (that is, during the photoelectric conversion time), optical charges may be generated and accumulated in the photoelectric conversion element PD.

After the optical accumulation step, the floating diffusion region FD may be reset with the power supply voltage (e.g., the second power supply voltage Vpix2) to provide a noise signal. Here, the noise signal may include a noise component. The noise signal including the noise component may be amplified by the first source follower transistor SF1.

In the noise signal sampling step according to some embodiments, the first sampling transistor SMP1 may be turned on, and the first capacitor C1 may sample the first sampling signal including the noise component.

Prior to the noise signal sampling step, the first capacitor C1 removes the previously sampled voltage, and the first source follower transistor SF1 may be pre-charged to be able to sample a new voltage. The pre-charge operation may be performed by a pre-charge transistor PC. In the noise signal sampling step, the second sampling transistor SMP2 may be turned off.

After the noise signal sampling step, the transfer transistor TX may be turned on again. The image signal may be amplified by the first source follower transistor SF1.

In the image signal sampling step according to some embodiments, the first sampling transistor SMP1 may be turned on, and the second capacitor C2 may sample the image signal.

Prior to the image signal sampling step, the second capacitor C2 removes the previously sampled voltage, and the first source follower transistor SF1 may be pre-charged to be able to sample a new voltage. Such a pre-charge operation may be performed by a pre-charge transistor PC. At the image signal sampling step, the first sampling transistor SMP1 may be turned off.

Each unit pixel (e.g., UP of FIG. 3) of the image sensor according to some embodiments may perform a correlated double sampling (CDS) operation. For example, each unit pixel UP doubly samples the noise signal and the image signal, and may output a difference level corresponding to a difference between the noise signal and the image signal to the output line Vout. Accordingly, the pixel signal from which the noise component is removed may be output to the output line Vout.

Referring to FIG. 4B, the image sensor according to some embodiments may include first and second photoelectric conversion elements PD1 and PD2, and first and second transfer transistors TX1 and TX2.

The first transfer transistor TX1 may be connected between the first photoelectric conversion element PD1 and the floating diffusion region FD. The second transfer transistor TX2 may be connected between the second photoelectric conversion element PD2 and the floating diffusion region FD. The first and second transfer transistors TX1 and TX2 may be controlled independently by the transmission signals. The first and second transfer transistors TX1 and TX2 may share the floating diffusion region FD.

The first and second photoelectric conversion elements PD1 and PD2 may be each located in different unit pixels UP or may be located in a single unit pixel UP. Similarly, the first and second transfer transistors TX1 and TX2 may be each located in different unit pixels UP or may be located in a single unit pixel UP.

Referring to FIG. 4C, the image sensor according to some embodiments may include first to fourth photoelectric conversion elements PD1 to PD4, and first to fourth transfer transistors TX1 to TX4.

A third transfer transistor TX3 may be connected between the third photoelectric conversion element PD3 and the floating diffusion region FD. A fourth transfer transistor TX4 may be connected between the fourth photoelectric conversion element PD4 and the floating diffusion region FD. The first to fourth transfer transistors TX1 to TX4 may be controlled independently by the transmission signals. The first to fourth transfer transistors TX1 to TX4 may share the floating diffusion region FD.

The first to fourth photoelectric conversion elements PD1 to PD4 may be each located in different unit pixels UP or may be located in a single unit pixel UP. Similarly, the first to fourth transfer transistors TX1 to TX4 may be each located in different unit pixels UP or may be located in a single unit pixel UP.

Figure 5:
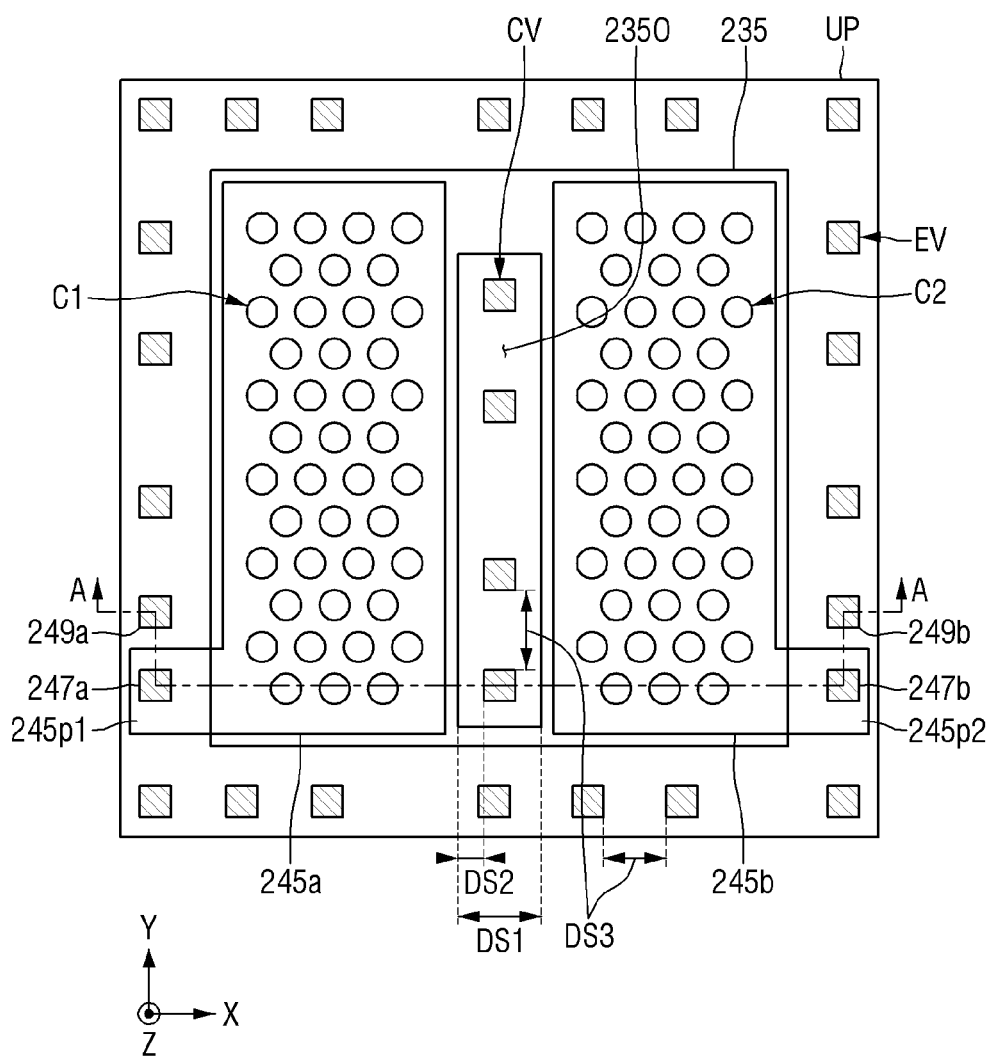
FIG. 5 is an exemplary layout diagram of unit pixels of the image sensor according to some embodiments.
Figure 6:
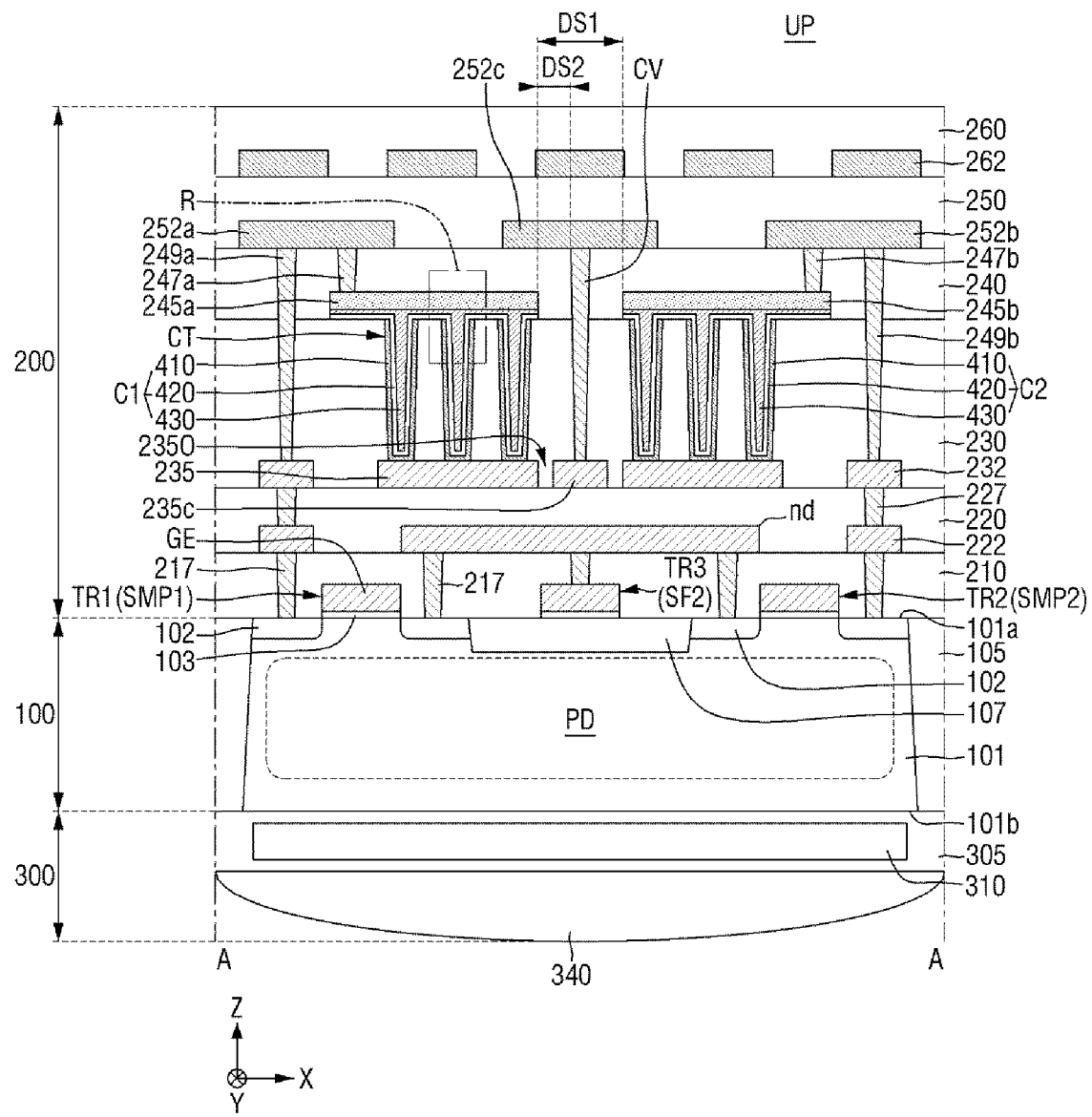
FIG. 6 is a cross-sectional view taken along a line A-A of FIG. 5.
Figure 7:
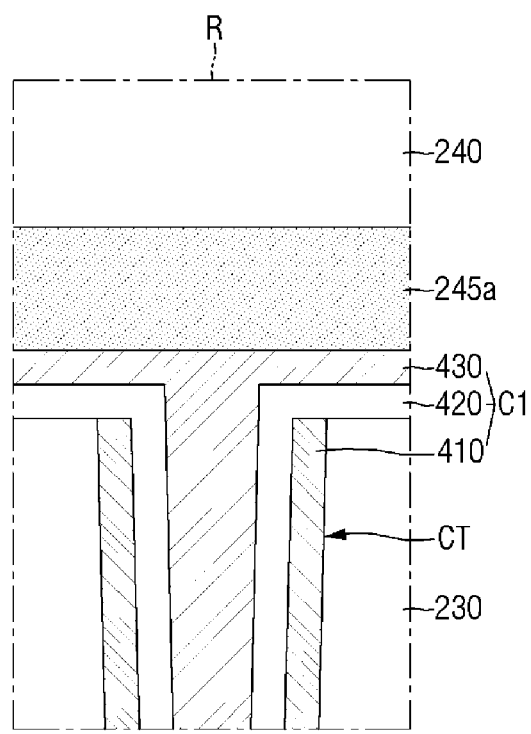
FIG. 7 is an enlarged view of a region R of FIG. 6.

FIG. 5 is an exemplary layout diagram for explaining the unit pixels of the image sensor according to some embodiments. FIG. 6 is a cross-sectional view taken along a line A-A of FIG. 5. FIG. 7 is an enlarged view for explaining a region R of FIG. 6. For brevity, redundant description of above-described elements in FIGS. 1 to 4C will be omitted.

Referring to FIGS. 5 to 7, each unit pixel UP of the image sensor according to some embodiments may include a photoelectric conversion structure 100, a wiring structure 200, and a light transmission structure 300.

The photoelectric conversion structure 100 may include a substrate 101, a pixel separation pattern 105, and a photoelectric conversion element PD. (Herein, a pattern refers to the material of an arranged design.)

The substrate 101 may be a semiconductor substrate. For example, the substrate 101 may be bulk silicon or SOI (silicon-on-insulator). The substrate 101 may be a silicon substrate or may include other materials, for example, silicon germanium, indium antimonide, lead tellurium compounds, indium arsenic, indium phosphide, gallium arsenide or gallium antimonide. Or, the substrate 101 may have an epitaxial layer formed on a base substrate.

The substrate 101 may include a first side 101a and a second side 101b opposite to each other. In embodiments to be explained below, the first side 101a may be referred to as a front side of the substrate 101, and the second side 101b may be referred to as a back side of the substrate 101.

Transistors TR1 to TR3 may be located on the first side 101a of the substrate 101. The transistors TR1 to TR3 may include at least some of transistors such as the transfer transistor TX, the reset transistor RX, the first source follower transistor SF1, the pre-charge transistor PC, the first sampling transistor SMP1, the second sampling transistor SMP2, the second source follower transistor SF2, and the selection transistor SEL explained above in the explanation of FIG. 4A.

Each of the transistors TR1 to TR3 may include a gate electrode GE and a source/drain region 102.

The gate electrode GE may be formed on the first side 101a of the substrate 101. The gate electrode GE may be spaced apart from the substrate 101 by a gate dielectric film 103. Although the gate electrode GE is only shown as extending along the first side 101a of the substrate 101, this is only an example. Although not shown, at least a part of the gate electrode GE of the transfer transistor TX extends in the vertical direction Z and may be embedded inside the substrate 101. The gate electrode GE may include, for example, but is not limited to, at least one of impurity-doped polysilicon, metal silicide such as cobalt silicide, metal nitride such as titanium nitride, and metals such as tungsten, copper and aluminum.

The source/drain region 102 may be formed in the substrate 101 on both sides of the gate electrode GE. The source/drain region 102 may be formed by doping impurities in the substrate 101. For example, the source/drain region 102 may be formed by ion-implantation of n-type impurities into the p-type substrate 101.

The second side 101b of the substrate 101 may be a photo receiving surface on which light is incident. That is, the image sensor according to some embodiments may be a backside illumination (BSI) image sensor.

Unit pixels UP may be defined on the substrate 101. The unit pixels UP may be arranged, for example, two-dimensionally (e.g., in the form of a matrix) in a plane defined by the first direction X and the second direction Y.

The pixel separation pattern 105 may be formed in the substrate 101. The pixel separation pattern 105 may be formed, for example, by embedding an insulating material in a deep trench formed by patterning the substrate 101.

The pixel separation pattern 105 may define a plurality of unit pixels UP. For example, the pixel separation pattern 105 may be formed in a grid pattern from a planar viewpoint to separate the unit pixels UP from each other. That is, the pixel separation pattern 105 may be formed to surround each unit pixel UP from a planar viewpoint. (Herein, a "planar viewpoint" is a viewpoint directly above or below a central region of a planar section of the image sensor. For example, a planar viewpoint may be a viewpoint that views a planar section of a unit pixel, where the planar section extends laterally from one edge of the unit pixel to an opposite edge, such as a plane that extends through the left edge and right edge of the unit pixel.)

Each unit pixel UP may include a photoelectric conversion element PD. The photoelectric conversion element PD may be formed in the substrate 101. The photoelectric conversion element PD may generate electric charges in proportion to the amount of light incident from the outside.

The photoelectric conversion element PD may be formed by doping impurities in the substrate 101. For example, the photoelectric conversion element PD may be formed by ion-implantation of n-type impurities into the p-type substrate 101. The photoelectric conversion element PD may have a potential slope in the vertical direction Z that intersects the surface of the substrate 101 (e.g., the first side 110a or the second side 110b). For example, the photoelectric conversion element PD may be in the form in which a plurality of impurity regions is stacked.

The device separation pattern 107 may be formed in the substrate 101. The device separation pattern 107 may be formed, for example, by embedding an insulating material in a shallow trench formed by patterning the substrate 101. The device separation pattern 107 may extend from the first side 101a of the substrate 101.

The device separation pattern 107 may define an active region inside each unit pixel UP. For example, the device separation pattern 107 may separate transistors TR1 to TR3 from each other.

The wiring structure 200 may be located on or adjacent to the first side 101a of the substrate 101, and may cover the transistors TR1 to TR3. The wiring structure 200 may include readout circuits and sampling circuits that are electrically connected to the photoelectric conversion element PD.

As an example, the wiring structure 200 may include first to sixth interlayer insulation film 210, 220, 230, 240, 250 and 260 sequentially stacked on the first side 101a of the substrate 101, first wirings 222, second wirings 232 and 235c, a lower electrode pad 235, a first capacitor C1, a second capacitor C2, upper electrode pads 245a and 245b, edge vias EV, central vias CV, third wirings 252a, 252b and 252c, and fourth wirings 262. It is noted here that in the present disclosure, the term "central" is used herein to describe a location of a component that is closer to a center line running through a larger structure than to the edges of the structure. For example, in FIGS. 5-7, each of the central vias CV is located close to or exactly at a center line (not shown) running parallel to and centrally between the left and right edges of the unit pixel UP. In other words, each of the central vias CV is closer to the center line than to left edge of the unit pixel UP and is closer to the center line than to right edge of the unit pixel UP.

The first interlayer insulation film 210 may be stacked on the first side 101a of the substrate 101. The first interlayer insulation film 210 may cover the transistors TR1 to TR3. The first wirings 222 may be situated on the first interlayer insulation film 210. The first wirings 222 may be electrically connected to the transistor TR1 to TR3 through short vias 217. For example, the short vias 217 penetrate the first interlayer insulation film 210 and may connect the first wirings 222 and the gate electrode GE of the transistors TR1 to TR3 or the source/drain region 102. Three centrally located short vias 217 may connect metallization forming the node "nd" of FIGS. 4A-4C to each of: a source/drain region 102 of transistor TR1 (e.g., transistor SMP1); a source/drain region of transistor TR2 (e.g., SMP2); and the gate electrode of transistor TR3 (e.g., transistor SF2).

The second interlayer insulation film 220 may be stacked on the first interlayer insulation film 210. The second interlayer insulation film 220 may cover the first wirings 222. The second wirings 232 and 235c may be situated on the second interlayer insulation film 220. The second wirings 232 may be electrically connected to the first wirings 222 through the first connection vias 227. For example, the first connection vias 227 may penetrate the second interlayer insulation film 220 to connect the second wirings 232 and the first wirings 222.

The lower electrode pad 235 may be disposed in the wiring structure 200 of each unit pixel UP. As an example, the lower electrode pad 235 may be formed on the second interlayer insulation film 220. The lower electrode pad 235 may have a plate shape. As an example, as shown in FIG. 5, the lower electrode pad 235 may have, but is not limited to, a rectangular plate shape.

A predetermined electrical potential may be applied to the lower electrode pad 235. For example, the second power supply voltage Vpix2 of FIG. 4A may be applied to the lower electrode pad 235. Thus, the lower electrode pad 235 may correspond to the second electrode of the first capacitor C1 and the second electrode of the second capacitor C2 of FIG. 4A.

The lower electrode pad 235 may be placed at the same level as the second wirings 232 and 235c. As used herein, the expression "placed at the same level" means the placement at the same height (in the Z direction) from the substrate 101. For example, the lower electrode pads 235 and the second wirings 232 and 235c may be placed at the same height with respect to the first side 101a of the substrate 101. As used herein, the term "same", in the context of a comparison among two or more distances or element dimensions, encompasses both "identical" and "nearly identical", where the latter is indicative of minute differences that may occur due to process margins and the like.

The lower electrode pad 235 may be formed at the same level as the second wirings 232 and 235c. As used herein, the expression "formed at the same level" means the formation by the same manufacturing process. For example, the lower electrode pad 235 may have the same material composition as the second wirings 232 and 235c.

The lower electrode pad 235 and the second wiring 235c may be connected to each other. For example, although not shown, a connection wiring may be placed at the same level as the node nd. The connection wiring may be disposed to be spaced apart from the node nd in the second direction Y. The connection wiring may be connected to the lower electrode pad 235 and the second wiring 235c through connection vias, respectively. Each of the connection vias may be extended through the third direction Z.

The first wirings 222, the contact 217, the second wirings 232 and 235c, the first connection vias 223 and the lower electrode pad 235 may each include a first conductive material. The first conductive material may include, for example, but is not limited to, at least one of a metal such as tungsten, titanium and tantalum, a conductive metal nitride such as titanium nitride, tantalum nitride and tungsten nitride, and combinations thereof.

The third interlayer insulation film 230 may be stacked on the second interlayer insulation film 220. The third interlayer insulation film 230 may cover the second wirings 232 and 235c and the lower electrode pad 235.

The first capacitor C1 and the second capacitor C2 may be placed on the lower electrode pad 235 of each unit pixel UP. As an example, the first capacitor C1 and the second capacitor C2 may be formed in the third interlayer insulation film 230. The first capacitor C1 and the second capacitor C2 may be electrically connected to the lower electrode pad 235.

The first capacitor C1 and the second capacitor C2 may be spaced apart from each other inside each unit pixel UP. For example, as shown in FIG. 5, the first capacitor C1 and the second capacitor C2 are spaced apart from each other and arranged along the first direction X.

A plurality of first capacitors C1 and a plurality of second capacitors C2 may be connected to the lower electrode pad 235. Adjacent first capacitors C1 and adjacent second capacitors C2 may be arranged in the form of a particular pattern. For example, as shown in FIG. 5, the first capacitors C1 and the second capacitors C2 may each be arranged in a honeycomb form. In other examples, the first capacitor C1 and the second capacitor C2 are each arranged in the form of a matrix.

The first capacitor C1 and the second capacitor C2 may include a lower electrode 410, a capacitor dielectric film 420 and an upper electrode 430, respectively. The lower electrode 410 may be electrically connected to the lower electrode pad 235. The lower electrode pad 235 may connect the lower electrode 410 of the first capacitor C1 to the lower electrode 410 of the second capacitor C2. The capacitor dielectric film 420 and the upper electrode 430 may be sequentially stacked on the lower electrode 410. That is, the capacitor dielectric film 420 may be interposed between the lower electrode 410 and the upper electrode 430.

The first capacitor C1 and the second capacitor C2 may each have a cylindrical form. For example, a plurality of capacitor trenches CT that exposes the lower electrode pad 235 may be formed in the third interlayer insulation film 230. The plurality of capacitor trenches CT may have a substantially uniform width. The lower electrode 410 may have portions that extend along the profiles of each capacitor trench CT in a conformal manner. The capacitor dielectric film 420 and the upper electrode 430 may be sequentially stacked on the lower electrode 410.

The capacitor dielectric film 420 may have portions that extend along the profiles of each capacitor trench CT on the lower electrode 410 in a conformal manner. The upper electrode 430 may have portions that fill the regions of the capacitor trenches CT which remain after the lower electrode 410 and the capacitor dielectric film 420 are formed. A part of the capacitor dielectric film 420 and a part of the upper electrode 430 may extend along the upper side of the third interlayer insulation film 230.

The lower electrode 410 and the upper electrode 430 may include, for example, but are not limited to, at least one of a high-fusion point metal film such as cobalt, titanium, nickel, tungsten and molybdenum, and/or a metal nitride film such as titanium nitride film (TiN), titanium silicon nitride film (TiSiN), titanium aluminum nitride film (TiAlN), tantalum nitride film (TaN), tantalum silicon nitride film (TaSiN), tantalum aluminum nitride film (TaAlN) and tungsten nitride film (WN), and combinations thereof.

The capacitor dielectric film 420 may include, for example, but is not limited to, at least one of a metal oxide such as $HfO_2$, $ZrO_2$, $Al_2O_3$, $La_2O_3$, $Ta_2O_3$ and $TiO_2$, a dielectric material of perovskite structure such as $SrTiO_3$ (STO), $(Ba,Sr)TiO_3$(BST), $BaTiO_3$, PZT, and PLZT, and combinations thereof. The capacitor dielectric film 420 may be a single film or may be multi-films.

The upper electrode pads 245a and 245b may be placed in the wiring structure 200 of each unit pixel UP. As an example, the upper electrode pads 245a and 245b may be formed on the second interlayer insulation film 220. The upper electrode pads 245a and 245b may have a plate shape.

The upper electrode pads 245a and 245b may include a first upper electrode pad 245a and a second upper electrode pad 245b which are spaced apart by a predetermined distance (e.g., a first distance DS1) inside each unit pixel UP. For example, as shown in FIG. 5, the first upper electrode pad 245a and the second upper electrode pad 245b may be spaced apart by the first distance DS1 in the first direction X, and may be arranged along the first direction X. The first distance DS1 may be about 0.3 μm to 0.4 μm.

The first distance DS1 at which the first upper electrode pad 245a and the second upper electrode pad 245b are spaced apart in the first direction X may be constant along the second direction Y. As used herein, the term "constant" means a fixed value but within an expected tolerance range (e.g., allowing for minute differences that may occur due to process margins and the like).

The first upper electrode pad 245a may be electrically connected to the first capacitor C1, and the second upper electrode pad 245b may be electrically connected to the second capacitor C2. For example, the first upper electrode pad 245a may extend along the upper side of the upper electrode 430 of the first capacitor C1, and the second upper electrode pad 245b may extend along the upper side of the upper electrode 430 of the second capacitor C2.

The upper electrode pads 245a and 245b may include, for example, but are not limited to, at least one of semiconductor materials such as impurity-doped polysilicon and silicon germanium, and/or metals such as tungsten, copper, aluminum, titanium and tantalum, and combinations thereof. The upper electrode pads 245a and 245b may include a material different from the upper electrode 430.

The fourth interlayer insulation film 240 may be stacked on the third interlayer insulation film 230. The fourth interlayer insulation film 240 may cover the upper electrode pads 245a and 245b. The third wirings 252a-252c may be placed on the fourth interlayer insulation film 240. The third wirings 252a and 252b may be electrically connected to the second pads 232, the first capacitor or the second capacitor C2 through edge vias EV and central vias CV to be explained below.

The edge vias EV and the central vias CVs may be placed around the first capacitor C1 and the second capacitor C2 in the wiring structure 200 of each unit pixel UP. The edge vias EV and the central vias CV may not overlap the lower electrode pads 235 in the vertical direction Z.

The edge vias EV may be interposed between the first capacitor C1 and the edges of each unit pixel UP, and between the second capacitor C2 and the edges of each unit pixel UP. For example, as shown in FIG. 5, the plurality of edge vias EV may be arranged along the edges of each unit pixel UP from a planar viewpoint.

The first capacitor C1 and the second capacitor C2 may be electrically connected to the edge vias EV. For example, the edge vias EV may include a first edge via 247a that penetrates the fourth interlayer insulation film 240 and connects the third wiring 252a and the first upper electrode pad 245a. Further, the edge vias EV may include a second edge via 247b that penetrates the fourth interlayer insulation film 240 and connects the third wiring 252b and the second upper electrode pad 245b.

The first upper electrode pad 245a may include a first protrusion 245p1 that protrudes toward the edges of each unit pixel UP. The first edge via 247a may penetrate the fourth interlayer insulation film 240 and be connected to the first protrusion 245p1. The second upper electrode pad 245b may include a second protrusion 245p2 that protrudes toward the edges of each unit pixel UP. The second edge via 247b may penetrate the fourth interlayer insulation film 240 and be connected to the second protrusion 245p2. Although both the first protrusion 245p1 and the second protrusion 245p2 are only shown as protruding in the first direction X, this is only an example. As another example, at least one of the first protrusion 245p1 and the second protrusion 245p2 may, of course, protrude in the second direction Y.

The edge vias EV may be connected to the second wirings 232 and 235c. For example, the second wirings 232 and 235c may include edge wirings 232 interposed between the lower electrode pad 235 and the edges of each unit pixel UP. The edge vias EV may include a third edge via 249a and a fourth edge via 249b that penetrate the third and fourth interlayer insulation films 230 and 240 and connect the third edge wirings 252 and the edge wirings 232.

The first capacitor C1 and the second capacitor C2 may be electrically connected to the transistors TR1 to TR3 through the edge vias EV.

As an example, the upper electrode 430 of the first capacitor C1 may be electrically connected to the source/drain region 102 of the first transistor TR1 through the first edge via 247a and the third edge via 249a. The first transistor TR1 may be a first sampling transistor SMP1. That is, the upper electrode 430 of the first capacitor C1 may be connected to a drain of the first sampling transistor SMP1. As explained above in the explanation of FIG. 4A, the first capacitor C1 may sample the electrical signal of the node nd.

As an example, the upper electrode 430 of the second capacitor C2 may be electrically connected to the source/drain region 102 of the second transistor TR2 through the second edge via 247b and fourth edge via 249b. The second transistor TR2 may be a second sampling transistor SMP2. For instance, and the upper electrode 430 of the second capacitor C2 may be connected to the drain of the second sampling transistor SMP2. As explained above in the expla-nation of FIG. 4A, the second capacitor C2 may sample the electrical signal of the node nd.

The gate electrode GE of the third transistor TR3 may be electrically connected to the source/drain region 102 of the first transistor TR1 and the source/drain region 102 of the second transistor TR2. The third transistor TR3 may be a second source follower transistor SF2. As explained above in the explanation of FIG. 4A, the second source follower transistor SF2 may be a source follower buffer amplifier that amplifies the potential change of the node nd to generate a source/drain current.

The central vias CV may be interposed between the first capacitor C1 and the second capacitor C2. For example, as shown in FIG. 5, the plurality of central vias CV may be arranged along the second direction Y between the first capacitor C1 and the second capacitor C2. Therefore, the edge vias EV and the central vias CV may be arranged to surround the periphery of the first capacitor C1 and the periphery of the second capacitor C2. The plurality of central vias CV may be interposed between the first upper electrode pad 245a and the second upper electrode pad 245b.

The plurality of central vias CV may be spaced from the lower electrode pad 235 by a predetermined distance (for example, a second distance DS2). Each of the plurality of central vias CV may also be spaced from the first upper electrode pad 245a by the second distance DS2. The second distance DS2 may be about 0.05 µm to about 0.2 µm.

The central vias CV may be connected to the lower electrodes 410 of each of the capacitors C1 and Cs through the lower electrode pad 235. In this case, the central vias CV may provide the power supply voltage Vpix2 to the lower electrodes 410. For example, the central vias CV may each have an upper end connected to the third wiring 252c, and the power supply voltage Vpix2 may be applied to the third wiring 252c. Each of the central vias CV may have a lower end connected to a second wiring 235c, which may be connected to the lower electrode pad 235. The central wiring 235c may be placed at the same level as the edge wirings 232 and spaced from the lower electrode pad 235. The central vias CV may penetrate the third and fourth interlayer insu-lation films 230 and 240.

The central wiring 235c may be placed inside the lower electrode pad 235 from the planar viewpoint. For example, the lower electrode pad 235 may include a lower opening 2350 that exposes the upper side of the second interlayer insulation film 220. The lower opening 2350 may be inter-posed between the first capacitor C1 and the second capaci-tor C2. The central pad 235c may be situated inside the lower opening 2350 of the lower electrode pad 235.

The plurality of central vias CV and the plurality of edge vias EV may be spaced from each other by a predetermined distance (for example, a third distance DS3). For example, as shown in FIG. 5, the plurality of edge vias EV may be spaced part from each other by the third distance DS3. The third distance DS3 may be about 0.1 µm to about 10 µm.

The central vias CV may be formed at the same level as the edge vias EV. For example, the central vias CV may have the same material composition as the edge vias EV.

The edge vias EV and the central vias CV may include, for example, but are not limited to, at least one of metals such as tungsten, titanium and tantalum, conductive metal nitrides such as titanium nitride, tantalum nitride and tung-sten nitride, and combinations thereof. The edge vias EV and the central vias CV may include the same first conductive material as the first wirings 222 and the second wirings 232 and 235c.

A fifth interlayer insulation film 250 may be stacked on the fourth interlayer insulation film 240. The fifth interlayer insulation film 250 may cover the third wirings 252a-252c. The fourth wirings 262 may be placed on the fifth interlayer insulation film 250. A sixth interlayer insulation film 260 may be stacked on the fifth interlayer insulation film 250. A sixth interlayer insulation film 260 may cover the fourth wirings 262.

The first to sixth interlayer insulation films 210, 220, 230, 240, 250 and 260 may include, for example, but are not limited to, at least one of silicon oxide, silicon nitride, silicon oxynitride and a low-k material having a lower dielectric constant than silicon oxide.

The third wirings 252a-252c and the fourth wirings 262 may each include conductive materials. The third wirings 252a-252c and the fourth wirings 262 may include a second conductive material having a lower specific resistance than the first conductive material. As an example, the first conductive material may include tungsten (W), and the second conductive material may include copper or a copper alloy. Here, the copper alloy may be an alloy in which a small amount of C, Ag, Co, Ta, In, Sn, Zn, Mn, Ti, Mg, Cr, Ge, Sr, Pt, Mg, Al or Zr is mixed in copper. Accordingly, the third wirings 252a-252c and the fourth wirings 262 may mitigate a signal delay. Each of the third wirings 252a-252c and the fourth wirings 262 may also include a barrier metal film.

The light transmission structure 300 may be arranged adjacent to on the second side 101b of the substrate 101. The light transmission structure 300 may include a surface insulation film 305, a color filter 310 and a microlens 340.

The surface insulation film 305 may be stacked on the second side 101b of the substrate 101. The surface insulation film 305 may include an insulating material. For example, the surface insulation film 305 may include, but is not limited to, at least one of silicon oxide, silicon nitride, silicon oxynitride, aluminum oxide, hafnium oxide, and a combination thereof.

The surface insulation film 305 may function as an anti-reflection film to prevent reflection of light incident on the substrate 101, thereby improving the photo receiving rate of the photoelectric conversion element PD. Further, the surface insulation film 305 may function as a flattening film to form a color filter 310 and a microlens 340, which will be described later, at a uniform height.

The color filter 310 may be placed inside the surface insulation film 140. The color filter 310 may be placed to correspond to each unit pixel UP. For example, the plurality of color filters 310 may be arranged two-dimensionally (for example, in the form of a matrix) in a plane defined by the first direction X and the second direction Y.

The color filter 310 may have various color filters according to the unit pixel UP. For example, the color filter 310 may be arranged in a Bayer pattern in which four adjacent unit pixels UP include a red color filter, a green color filter, and a blue color filter. However, this is only an example, and the color filter 310 may also be arranged in a tetra pattern in which four adjacent unit pixels UP have the same color. Or, the color filter 310 may include a yellow filter, a magenta filter and a cyan filter, and may further include a white filter.

The microlens 340 may be placed on the color filter 310. The microlens 340 may be arranged to correspond to each unit pixel UP. For example, a plurality of microlenses 340 may be arranged two-dimensionally (for example, in the form of a matrix) in a plane defined by first direction X and the second direction Y.

The microlens 340 has a convex shape, and may have a predetermined radius of curvature. Accordingly, the microlens 340 may collect the light incident on the photoelectric conversion element PD. The microlens 340 may include, for example, but is not limited to, a light transmission resin.

In general, to implement the global shutter operation of an image sensor, capacitors may be placed in the wiring structures of each unit pixel. However, as image sensors have increasingly become highly integrated, there is a problem in related art image sensors involving the difficulty in securing a space for vias placed around the capacitors due to the space occupied by the capacitors.

However, the image sensor according to some embodiments is provided with both the edge vias EV and the central vias CV to efficiently arrange the vias around the first capacitor C1 and the second capacitor C2. As mentioned above, the edge vias EV may be arranged along the edges of each unit pixel UP, and the central vias CV may be interposed between the first capacitor C1 and the second capacitor C2. Accordingly, even if the shape of the lower electrode pad 235 or the upper electrode pads 245a and 245b is not changed, the vias around the first capacitor C1 and the second capacitor C2 (i.e., the edge vias EV and the central vias CV) may be arranged efficiently, and an image sensor with improved integration may be provided.

Figure 8:
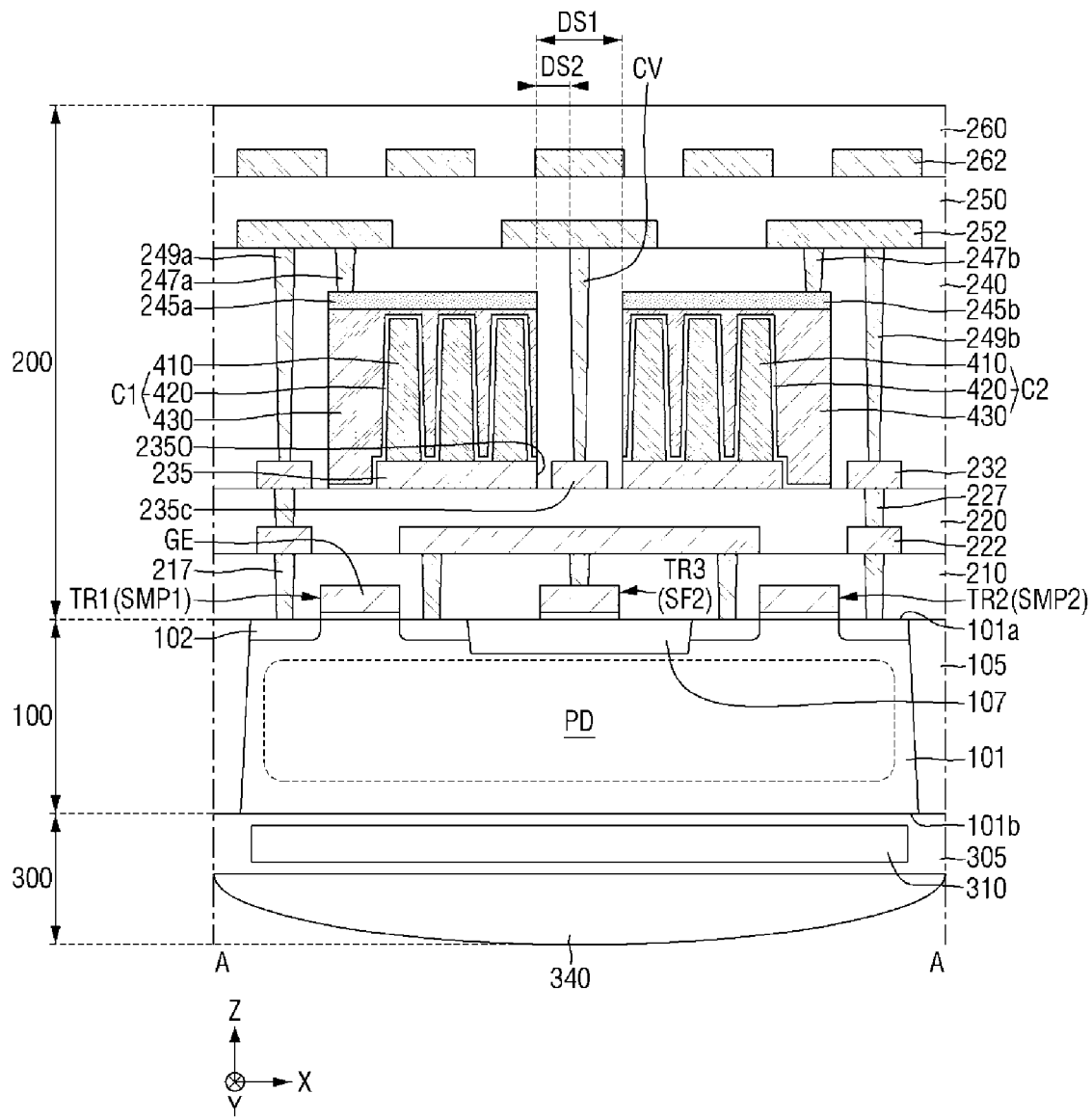
FIGS. 8 and 9 are cross-sectional views of unit pixels of the image sensor according to respective embodiments.
Figure 9:
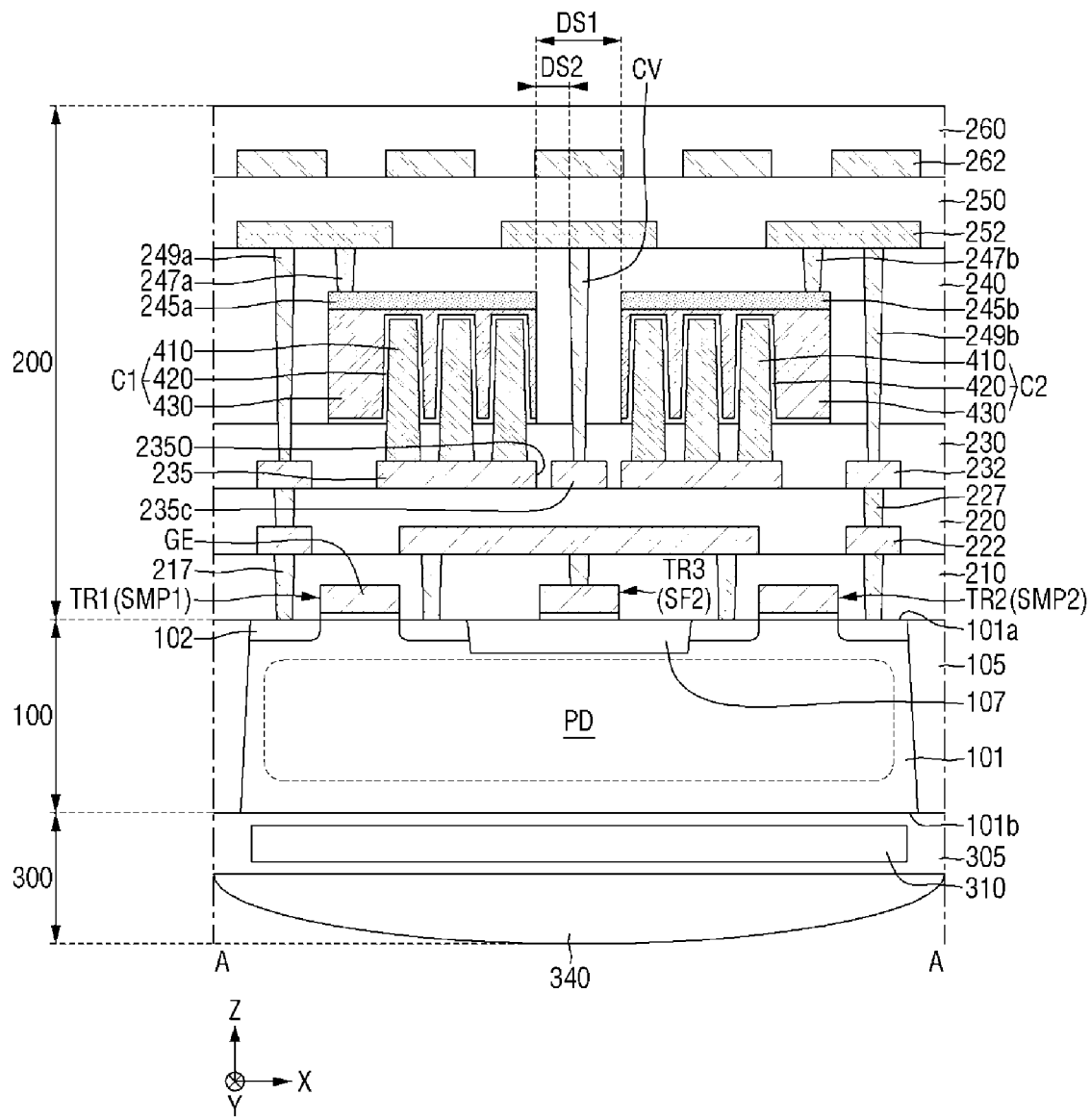

FIGS. 8 and 9 are various cross-sectional views for explaining the unit pixels of the image sensor according to some embodiments. For brevity, redundant description of above-described features in FIGS. 1 to 7 will be omitted.

Referring to FIG. 8, in the image sensor according to some embodiments, the lower electrode 410 may have a plurality of pillar shapes.

The plurality of pillar-shaped lower electrodes 410 may be arranged in a honeycomb form. In other examples, the plurality of lower electrodes 410 may be arranged in other forms, such as the form of a matrix. The upper sides of the lower electrodes 410 may be substantially coplanar with one another. Further, the width of the lower electrodes 410 may have a substantially uniform width. For example, in any plane, the width of any lower electrode may be uniform to within +/−10% throughout its vertical extent.

The capacitor dielectric film 420 may extend along the surface of the lower electrode 410 in a conformal manner.

The upper electrode 430 of the first capacitor C1 may cover the capacitor dielectric film 420 of the first capacitor C1, and the upper electrode 430 of the second capacitor C2 may cover the capacitor dielectric film 420 of the second capacitor C2. Further, the upper electrode 430 of the first capacitor C1 may fill the space between the lower electrodes 410 of the first capacitor C1, and the upper electrode 430 of the second capacitor C2 may fill the space between the lower electrodes 410 of the second capacitor C2.

The central vias CV may be interposed between the upper electrode 430 of the first capacitor C1 and the upper electrode 430 of the second capacitor C2.

Referring to FIG. 9, in the image sensor according to some embodiments, the lowermost side of the capacitor dielectric film 420 may be placed to be higher than the lower sides of the lower electrodes 410.

For example, the plurality of pillar-shaped lower electrodes 410 may protrude from the upper side of the third interlayer insulation film 230. In some embodiments, the capacitor dielectric film 420 may extend in a conformal manner along the upper side of the third interlayer insulation film 230 and the surfaces of the lower electrodes 410 that protrude upward from the upper side of the third interlayer insulation film 230.

Figure 10:
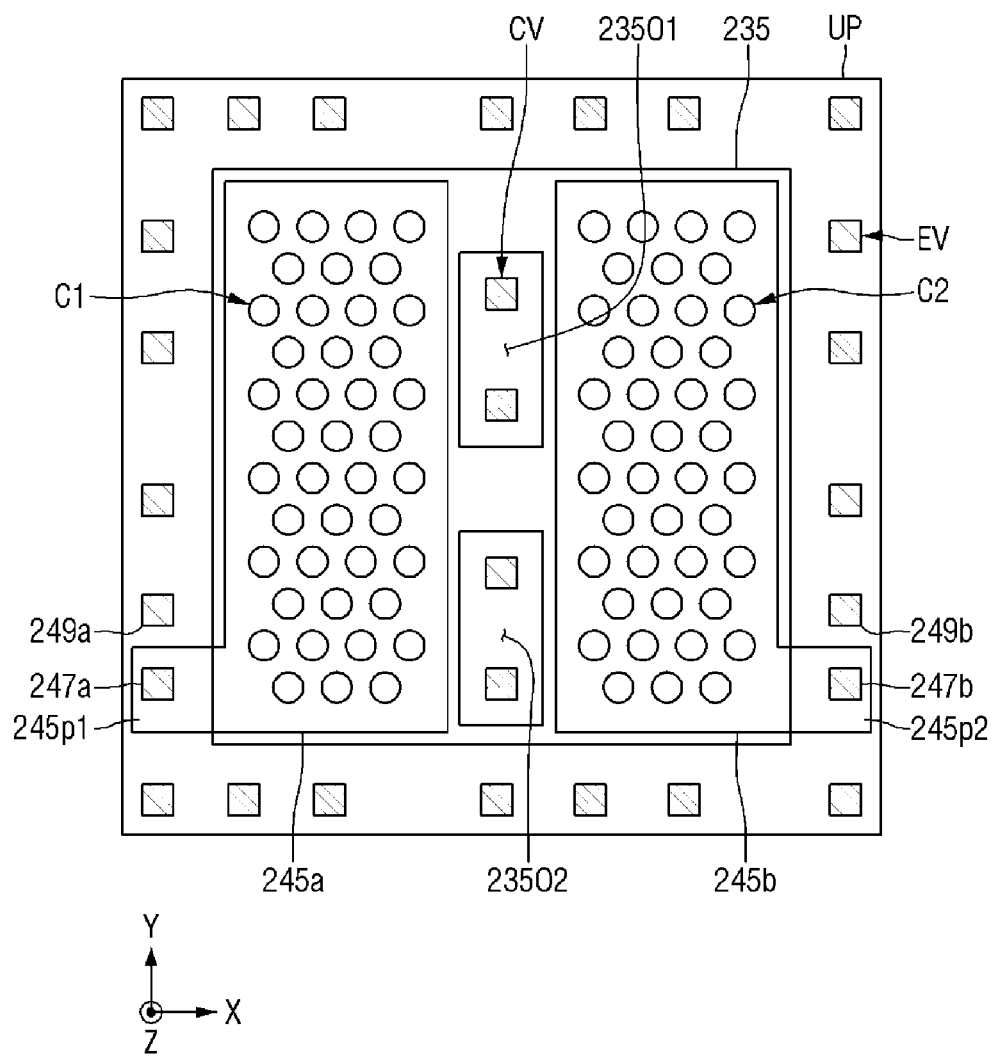
FIGS. 10 and 11 are exemplary layout views of unit pixels of the image sensor according to respective embodiments.

FIG. 10 is a view of an example layout that may be used for any of the unit pixels UP of the image sensor according to some embodiments. For brevity, redundant description of above-described elements in FIGS. 1 to 9 will be omitted.

As shown in FIG. 10, in the image sensor according to some embodiments, the lower electrode pads 235 may include a first opening 23501 and a second opening 23502 that are spaced apart from each other.

The first opening 23501 and the second opening 23502 may be arranged, for example, along the second direction Y. Some (one or more) of the central vias CV may be disposed in the first opening 23501, and the remaining central vias CV may be placed in the second opening 23502.

Although the lower electrode pad 235 is shown in FIG. 10 with two openings, in other examples the lower electrode pad 235 has three or more openings within which a respective one or more central vias CV are disposed.

Figure 11:
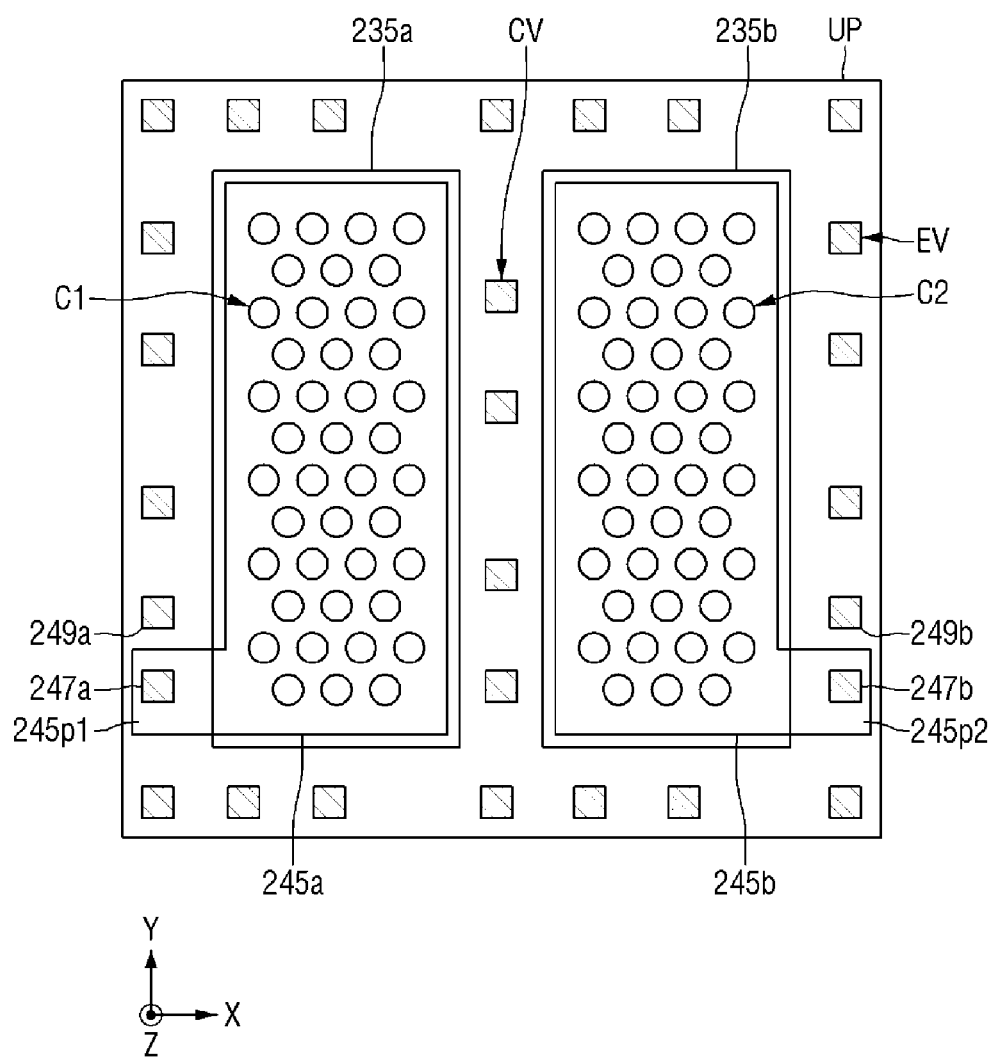

Referring to FIG. 11, in the image sensor according to some embodiments, the lower electrode pads 235a and 235b may include a first lower electrode pad 235a and a second lower electrode pad 235b that are spaced apart from each other by a predetermined distance in each unit pixel UP.

For example, the first upper electrode pad 245a and the second upper electrode pad 245b may be spaced apart from each other and arranged along the first direction X. The distance at which the first lower electrode pad 235a and the second lower electrode pad 235b are spaced apart in the first direction X may be constant along the second direction Y.

The first lower electrode pad 235a may be electrically connected to the first capacitor C1, and the second lower electrode pad 235b may be electrically connected to the second capacitor C2. For example, the lower electrode (e.g., 410 of FIG. 6) of the first capacitor C1 may be connected to the first upper electrode pad 245a, and the lower electrode (e.g., 410 of FIG. 6) of the second capacitor C2 may be connected to the second upper electrode pad 245b.

Figure 12:
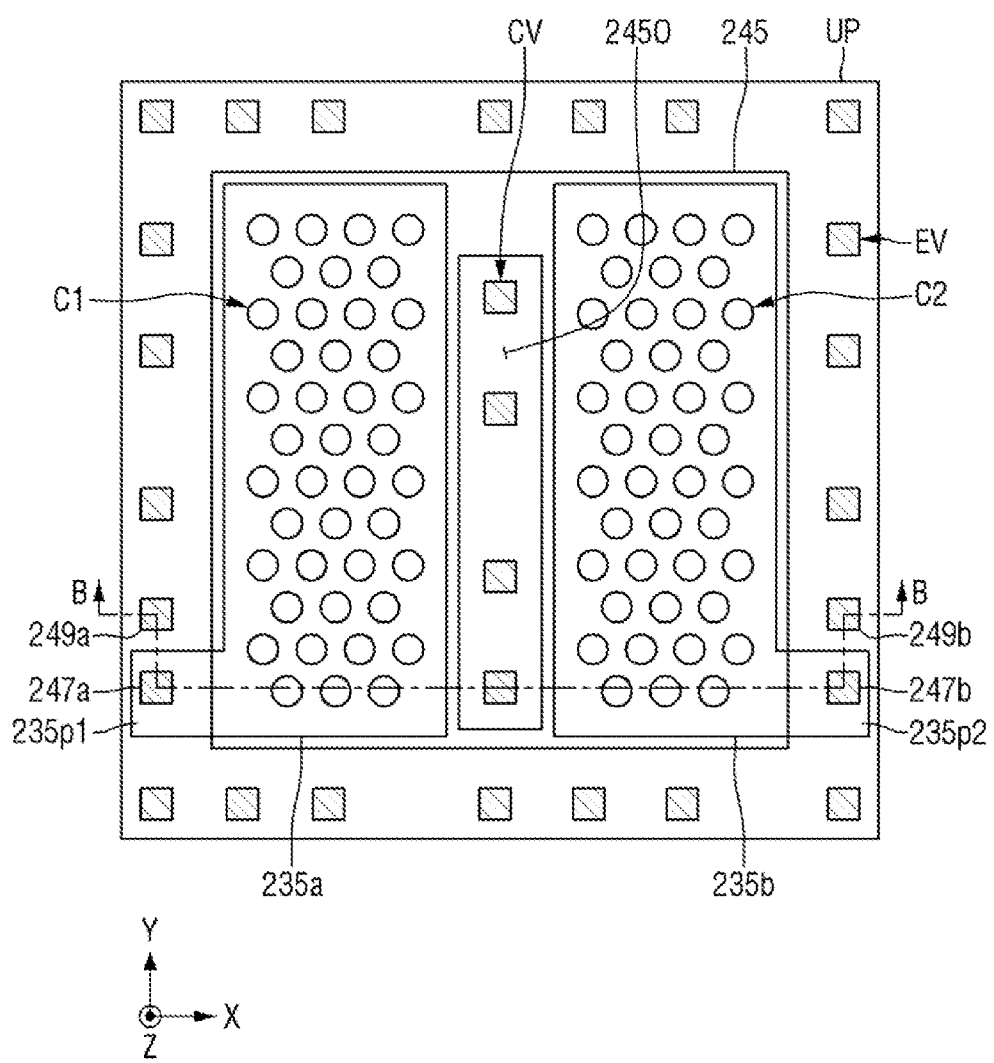
FIG. 12 is an exemplary layout diagram of unit pixels of a image sensor according to some embodiments.
Figure 13:
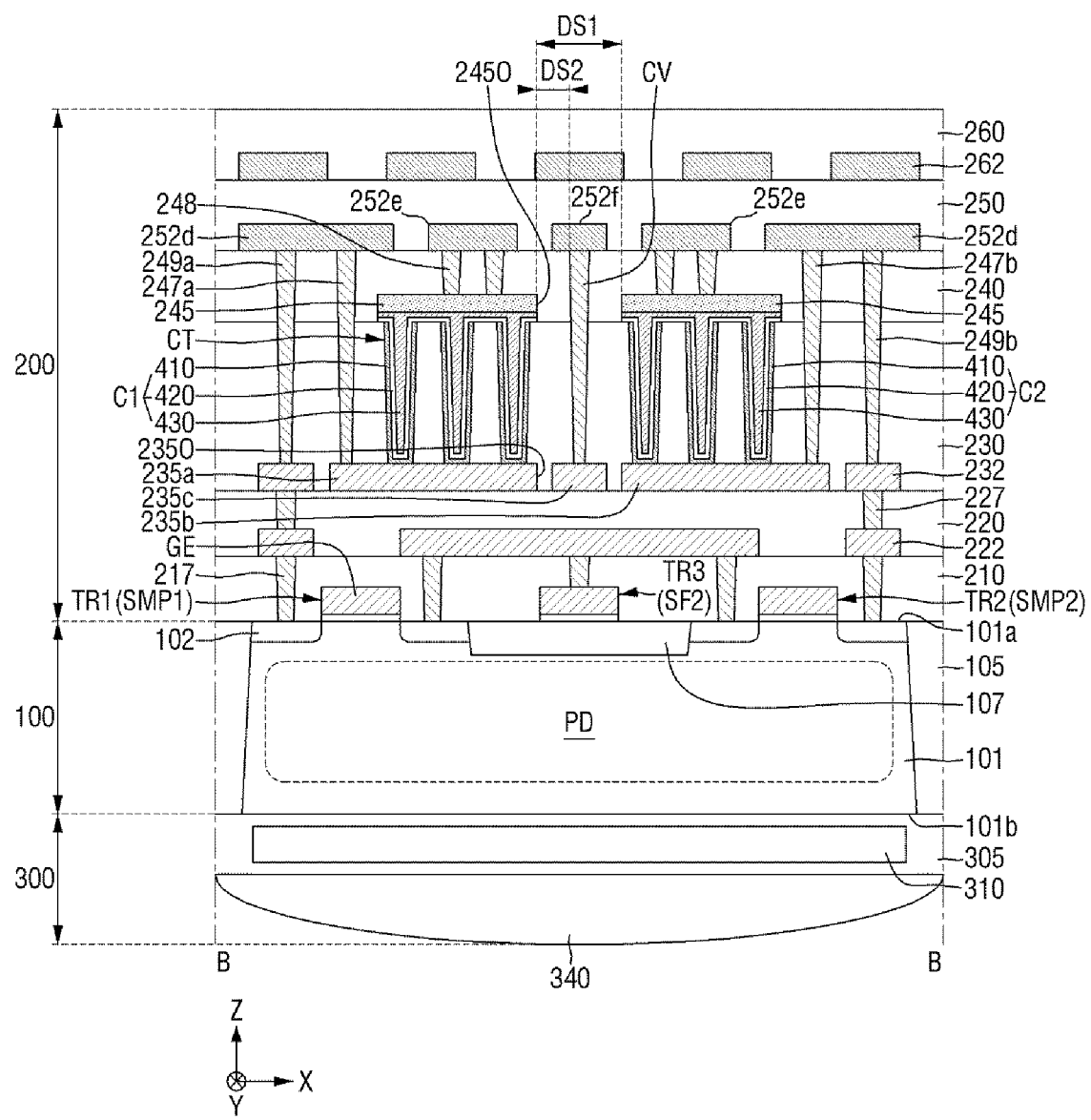
FIG. 13 is a cross-sectional view taken along the line B-B of FIG. 12.

FIG. 12 is an exemplary layout diagram for explaining the unit pixels of the image sensor according to some embodiments. FIG. 13 is a cross-sectional view taken along the line B-B of FIG. 12. For brevity, redundant description of above-described elements in FIGS. 1 to 11 will be omitted.

Referring to FIGS. 12 and 13, in the image sensor according to some embodiments, the central vias CV may penetrate the upper electrode pad 245.

For example, the upper electrode pad 245 may include an upper opening 2450 that exposes the upper side of the third interlayer insulation film 230. The upper opening 2450 may be interposed between the first capacitor C1 and the second capacitor C2. The central vias CV may be placed inside the upper opening 2450 of the upper electrode pad 245.

A predetermined electrical potential may be applied to the upper electrode pad 245. For example, the second power supply voltage Vpix2 of FIG. 4A may be applied to the upper electrode pad 245. Thus, the upper electrode pad 245 may correspond to the second electrode of the first capacitor C1 and the second electrode of the second capacitor C2 of FIG. 4A. As an example, second connection vias 248 that penetrate the fourth interlayer insulation film 240 and connect third wirings 252e and the upper electrode pad 245 may be formed. The third wirings 252e may apply a predetermined electrical potential to the upper electrode pad 245 through the second connection vias 248.

The upper electrode pad 245 may connect the upper electrode 430 of the first capacitor C1 and the upper electrode 430 of the second capacitor C2.

The lower electrode 410 of the first capacitor C1 may be electrically connected to the source/drain region 102 of the first transistor TR1. As an example, the first edge via 247a may penetrate the third and fourth interlayer insulation films 230 and 240 to connect a third wiring 252d and the first lower electrode pad 235a.

The lower electrode 410 of the second capacitor C2 may be electrically connected to the source/drain region 102 of the second transistor TR2. As an example, the second edge via 247b may penetrate the third and fourth interlayer insulation films 230 and 240 to connect a third wirings 252d and the second lower electrode pad 235b.

The first lower electrode pad 235a may include a third protrusion 235p1 that protrudes toward the edges of each unit pixel UP. The first edge via 247a may be connected to the third protrusion 235p1. The second lower electrode pad 235b may include a fourth protrusion 235p2 that protrudes toward the edges of each unit pixel UP. The second edge via 247b may be connected to the fourth protrusion 235p2. Although both the third protrusion 235p1 and the fourth protrusion 235p2 are only shown as protruding in the first direction X, this is only an example. As another example, at least one of the third protrusion 235p1 and the fourth protrusion 235p2 may, of course, protrude in the second direction Y.

Figure 14:
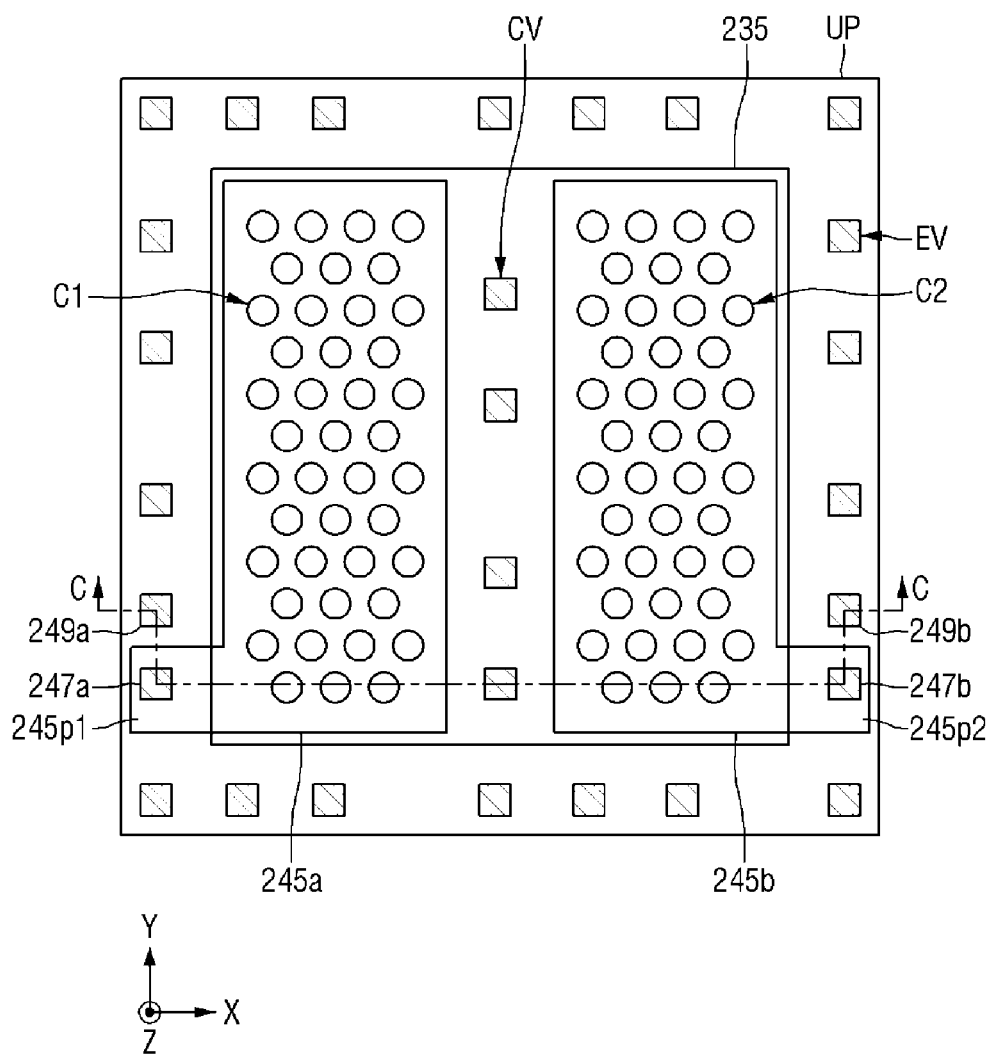
FIG. 14 is an exemplary layout diagram of unit pixels of an image sensor according to some embodiments.
Figure 15:
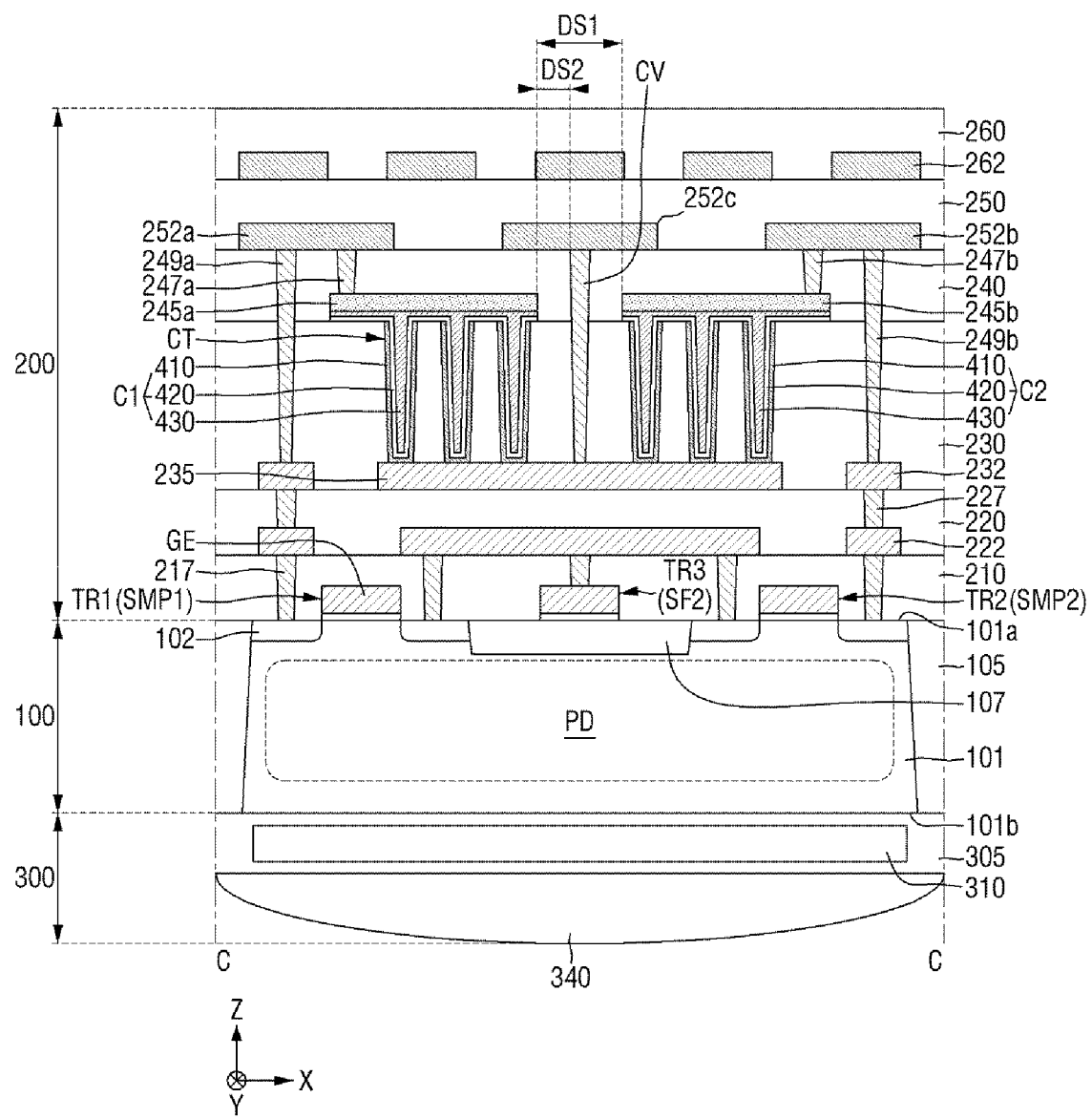
FIG. 15 is a cross-sectional view taken along the line C-C of FIG. 14.

FIG. 14 is an exemplary layout diagram of an example unit pixel UP of the image sensor according to some embodiments. FIG. 15 is a cross-sectional view taken along the line C-C of FIG. 14. For brevity, redundant description of above-described elements in FIGS. 1 to 7 will be omitted.

Referring to FIGS. 14 and 15, in each of a plurality of unit pixels of the image sensor according to some embodiments, one or more of the central vias CV may be connected to the lower electrode pad 235.

For example, one or more of the central vias CV may penetrate the third and fourth interlayer insulation films 230 and 240 and connect a third wiring 252c and the lower electrode pad 235.

The third wiring 252c may apply a predetermined electrical potential (e.g., the second power supply voltage Vpix2 of FIG. 4A) to the lower electrode pad 235 through at least a part of the central vias CV. A third wiring 252f may connect to an upper end of the central via CV. The second wiring 235c may connect to a lower end of the central via CV.

Figure 16:
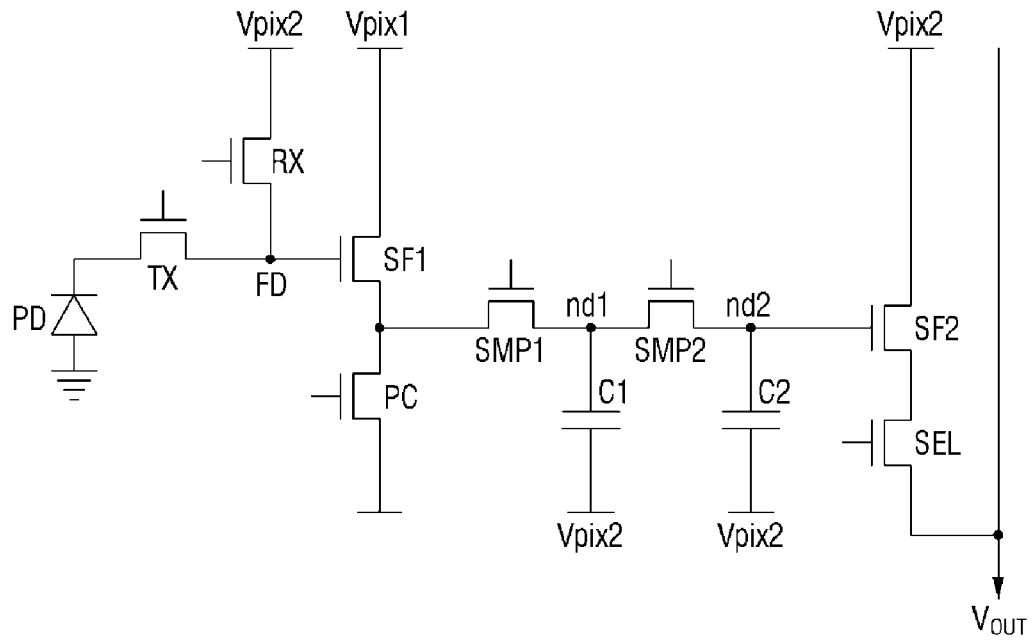
FIGS. 16 and 17 are respective exemplary circuit diagrams of unit pixels of an image sensor according to some embodiments.
Figure 17:
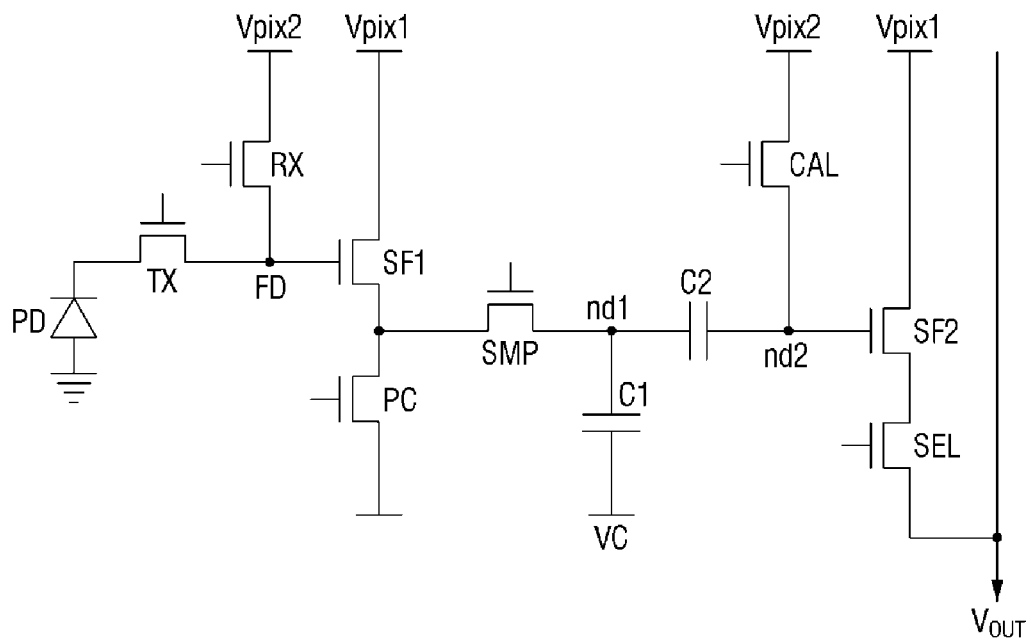

FIGS. 16 and 17 are example circuit diagrams of unit pixels of the image sensor according to respective embodiments. For brevity, redundant description of above-described elements in FIGS. 1 to 15 will be omitted.

Referring to FIG. 16, in the image sensor according to some embodiments, a first sampling transistor SMP1 may be connected between the source of the first source follower transistor SF1 and the first node nd1, and a second sampling transistor SMP2 may be connected between the first node nd1 and the second node nd2.

A first electrode of the first capacitor C1 may be connected to the first node nd1, and a predetermined electrical potential (e.g., the second power supply voltage Vpix2) may be applied to the second electrode of the first capacitor C1.

The first electrode of the second capacitor C2 may be connected to the first node nd1, and a predetermined electrical potential (e.g., the second power supply voltage Vpix2) may be applied to the second electrode of the second capacitor C2.

The gate electrode (the second source/follower gate electrode) of the second source follower transistor SF2 may be connected to the second node nd2. The second source follower transistor SF2 may be a source follower buffer amplifier that amplifies the potential change of the second node nd2 to generate a source/drain current.

At a noise signal sampling step according to some embodiments, the first sampling transistor SMP1 may be turned on, and the first capacitor C1 may sample the first sampling signal including the noise component.

At an image signal sampling step according to some embodiments, the first sampling transistor SMP1 and the second sampling transistor SMP2 may be turned on, and the second capacitor C2 may sample the image signal.

Therefore, each unit pixel (e.g., UP of FIG. 3) of the image sensor according to some embodiments may perform a correlated double sampling (CDS) operation.

Referring to FIG. 16, the image sensor according to some embodiments may include a sampling transistor SMP and a calibration transistor CAL.

The sampling transistor SMP may be connected between the source of the first source follower transistor SF1 and the first node nd1.

The first electrode of the first capacitor C1 and the first electrode of the second capacitor C2 may be connected to the first node nd1. A predetermined electrical potential (e.g., a capacitor voltage VC) may be applied to the second electrode of the first capacitor C1. The second electrode of the second capacitor C2 may be connected to the second node nd2.

A drain of the calibration transistor CAL may be connected to the power supply voltage (e.g., the second power supply voltage Vpix2), and a source of the calibration transistor CAL may be connected to the second node nd2. The second node nd2 may be calibrated by the calibration transistor CAL.

At the noise signal sampling step according to some embodiments, the sampling transistor SMP may be turned on, and the first capacitor C1 and the second capacitor C2 may sample the first sampling signal including the noise component. At the noise signal sampling step, the calibration transistor CAL may be turned off.

At the image signal sampling step according to some embodiments, the sampling transistor SMP and the calibration transistor CAL may be turned on, and the first capacitor C1 and the second capacitor C2 may sample the image signal.

Here, the voltage of the first capacitor C1 may be a voltage value that is proportional to an amount of electric charge transmitted by the transfer transistor TX. Accordingly, the voltage of the first capacitor C1 at the image signal sampling step may have a new value different from the voltage at the noise signal sampling step. The second node nd2 of the second capacitor C2 may float, and the electric charge amount of the second capacitor C2 may be maintained at the electric charge amount at the previous noise signal sampling step. Since the second node nd2 of the second capacitor C2 is calibrated to the calibrated voltage (e.g., Vpix), it may not include a noise component.

The unit pixel circuits of FIGS. 16 and 17 may include central vias CV between the capacitors C1 and C2, as well as edge vias EV to connect circuit elements in a similar manner to that described above in the embodiments of FIGS. 1-15.

While the inventive concept has been particularly shown and described with reference to embodiments thereof, it will be understood that various changes in form and details may be made therein without departing from the spirit and scope of the following claims.

What is claimed is:

1. An image sensor comprising:
a plurality of unit pixels, each comprising:
a substrate including first and second sides which are opposite to each other;
a photoelectric conversion layer in the substrate; and
a wiring structure adjacent the first side of the substrate;
wherein the wiring structure includes:
a first capacitor;
a second capacitor spaced from the first capacitor;
a plurality of edge vias arranged along edges of the unit pixel; and
a plurality of central vias interposed between the first capacitor and the second capacitor,
wherein in a plane extending through lateral sides of the image sensor, the plurality of edge vias and the plurality of central vias surround a periphery of the first capacitor and a periphery of the second capacitor.

2. The image sensor of claim 1, wherein the first side of the substrate has a planar surface, and the first capacitor and the second capacitor are arranged along a first direction parallel to the planar surface, and
the plurality of central vias are arranged along a second direction parallel to the planar surface and intersecting the first direction.

3. The image sensor of claim 1, wherein each of the first capacitor and the second capacitor includes a lower electrode, a capacitor dielectric film and an upper electrode which are sequentially stacked on the first side of the substrate, and
the wiring structure includes a lower electrode pad connected to the lower electrode, and an upper electrode pad connected to the upper electrode.

4. The image sensor of claim 3, wherein the lower electrode pad connects the lower electrode of the first capacitor and the lower electrode of the second capacitor,
the upper electrode pad includes a first upper electrode pad connected to the upper electrode of the first capacitor, and a second upper electrode pad spaced apart from the first upper electrode pad and connected to the upper electrode of the second capacitor, and
the plurality of central vias is interposed between the first upper electrode pad and the second upper electrode pad.

5. The image sensor of claim 3, wherein the lower electrode pad includes a first lower electrode pad connected to the lower electrode of the first capacitor, and a second lower electrode pad spaced from the first lower electrode pad and connected to the lower electrode of the second capacitor,
the upper electrode pad connects the upper electrode of the first capacitor and the upper electrode of the second capacitor, and
the plurality of central vias is interposed between the first lower electrode pad and the second lower electrode pad.

6. The image sensor of claim 3, wherein the wiring structure further includes an edge wiring and a central wiring which are placed at a level equivalent to the lower electrode pad and are spaced from each other,
each of the edge vias is connected to the edge wiring, and each of the central vias is connected to the central wiring.

7. The image sensor of claim 1, further comprising:
a first transistor and a second transistor on the first side of the substrate,
wherein the first capacitor is connected to the first transistor, and the second capacitor is connected to the second transistor.

8. The image sensor of claim 7, wherein the plurality of edge vias includes a first edge via which connects the first capacitor and a source/drain region of the first transistor, and a second edge via which connects the second capacitor and a source/drain region of the second transistor.

9. The image sensor of claim 1, further comprising:
a color filter and a microlens which are sequentially stacked on the second side of the substrate.

10. An image sensor comprising:
a plurality of unit pixels, each comprising:
a substrate including a first side and a second side which are opposite to each other;
a photoelectric conversion layer in the substrate;
a color filter and a microlens sequentially stacked on the second side of the substrate;
a first sampling transistor and a second sampling transistor on the first side of the substrate;
a wiring structure on the first side of the substrate, wherein the wiring structure covers the first sampling transistor and the second sampling transistor and comprises:
a first capacitor connected to a source/drain region of the first sampling transistor;
a second capacitor connected to a source/drain region of the second sampling transistor;
a plurality of edge vias arranged along edges of the unit pixel; and
a plurality of central vias interposed between the first capacitor and the second capacitor,
wherein in a plane extending through lateral sides of the image sensor, the plurality of edge vias and the plurality of central vias surround a periphery of the first capacitor and a periphery of the second capacitor.

11. The image sensor of claim 10, where each of the unit pixels further comprise:
a source follower transistor on the first side of the substrate,
wherein the source/drain region of the first sampling transistor and the source/drain region of the second sampling transistor are connected to a gate electrode of the source follower transistor.

* * * * *